United States Patent
Sakakibara

(10) Patent No.: US 11,683,612 B2
(45) Date of Patent: Jun. 20, 2023

(54) SOLID STATE IMAGING DEVICE AND ELECTRONIC DEVICE

(71) Applicant: SONY GROUP CORPORATION, Tokyo (JP)

(72) Inventor: Masaki Sakakibara, Kanagawa (JP)

(73) Assignee: SONY GROUP CORPORATION, Tokyo (JP)

( * ) Notice: Subject to any disclaimer, the term of this patent is extended or adjusted under 35 U.S.C. 154(b) by 89 days.

(21) Appl. No.: 17/338,314

(22) Filed: Jun. 3, 2021

(65) Prior Publication Data

US 2021/0289159 A1    Sep. 16, 2021

Related U.S. Application Data

(63) Continuation of application No. 15/544,970, filed as application No. PCT/JP2016/051081 on Jan. 15, 2016, now Pat. No. 11,070,758.

(30) Foreign Application Priority Data

Jan. 30, 2015    (JP) .................................. 2015-016477

(51) Int. Cl.
    *H04N 5/3745*    (2011.01)
    *H04N 25/772*    (2023.01)
    (Continued)

(52) U.S. Cl.
    CPC .......... *H04N 25/772* (2023.01); *G01S 7/4815* (2013.01); *G01S 7/4863* (2013.01);
    (Continued)

(58) Field of Classification Search
    CPC .............. H04N 5/37455; H04N 5/351; H04N 5/37452; H01L 27/1464; H01L 27/14636;
    (Continued)

(56) References Cited

U.S. PATENT DOCUMENTS

| 11,070,758 B2 | 7/2021 | Sakakibara |
| 2012/0217413 A1* | 8/2012 | Kameshima ......... A61B 6/4233 |
| | | 250/394 |

(Continued)

FOREIGN PATENT DOCUMENTS

| JP | 2006-197393 | 7/2006 |
| JP | 2012-217058 | 11/2012 |

(Continued)

OTHER PUBLICATIONS

International Search Report and Written Opinion for International (PCT) Patent Application No. PCT/JP2016/051081, dated Apr. 5, 2016, 10 pages.

(Continued)

*Primary Examiner* — Georgia Y Epps
*Assistant Examiner* — Don J Williams
(74) *Attorney, Agent, or Firm* — Sheridan Ross P.C.

(57) ABSTRACT

The present disclosure relates to a solid state imaging device and an electronic device from which a holding unit for holding information in a pixel can be eliminated. When a charge distribution unit distributes a pixel signal SIG to a first ADC, a pixel signal representing only reflection light is divided for allocation. When the charge distribution unit distributes a pixel signal SIG to a second ADC, a pixel signal representing background light and reflection light (partial) is divided for allocation. When the charge distribution unit distributes a pixel signal SIG to a third ADC, a pixel signal representing background light and reflection light (the rest) is divided for allocation. During a period in which no signal is acquired, a discharge transistor functions as an overflow portion for releasing electrical charge. The present disclosure can be applied to, for example, a solid state imaging device used for an imaging device.

20 Claims, 17 Drawing Sheets

(51) Int. Cl.
  *G01S 7/481*    (2006.01)
  *G01S 7/4863*   (2020.01)
  *H01L 27/146*   (2006.01)
  *G01S 17/894*   (2020.01)
  *H04N 25/50*    (2023.01)
  *H04N 25/771*   (2023.01)

(52) U.S. Cl.
  CPC ...... *G01S 17/894* (2020.01); *H01L 27/14634* (2013.01); *H01L 27/14636* (2013.01); *H04N 25/50* (2023.01); *H04N 25/771* (2023.01); *H01L 27/1464* (2013.01)

(58) Field of Classification Search
  CPC ............. H01L 27/14634; G01S 7/4863; G01S 17/894; G01S 7/4815
  See application file for complete search history.

(56) References Cited

U.S. PATENT DOCUMENTS

| | | |
|---|---|---|
| 2015/0124138 A1 | 5/2015 | Ueda et al. |
| 2015/0162925 A1 | 6/2015 | Lee et al. |
| 2015/0163403 A1 | 6/2015 | Wakabayashi |
| 2015/0281613 A1 | 10/2015 | Vogelsang et al. |

FOREIGN PATENT DOCUMENTS

| | | |
|---|---|---|
| JP | 2013-143598 | 7/2013 |
| TW | 201404145 | 1/2014 |
| WO | WO 2014/055391 | 4/2014 |

OTHER PUBLICATIONS

Official Action (with English translation) for Chinese Patent Application No. 201680005290.6, dated Jul. 22, 2019, 15 pages.
Official Action (with English translation) for Chinese Patent Application No. 201680005290.6, dated Mar. 3, 2020, 16 pages.
Official Action for U.S. Appl. No. 15/544,970, dated Jun. 20, 2019, 8 pages.
Official Action for U.S. Appl. No. 15/544,970, dated Jan. 10, 2020, 9 pages.
Official Action for U.S. Appl. No. 15/544,970, dated May 12, 2020, 10 pages.
Official Action for U.S. Appl. No. 15/544,970, dated Oct. 30, 2020, 11 pages.
Notice of Allowance for U.S. Appl. No. 15/544,970, dated Mar. 4, 2021, 8 pages.

* cited by examiner

SOLID STATE IMAGING DEVICE AND ELECTRONIC DEVICE

CROSS REFERENCE TO RELATED APPLICATIONS

This application is a continuation application of pending U.S. patent application Ser. No. 15/544,970, filed Jul. 20, 2017, which is a national stage application under 35 U.S.C. 371 and claims the benefit of PCT Application No. PCT/JP2016/051081 having an international filing date of 15 Jan. 2016, which designated the United States, which PCT application claimed the benefit of Japanese Patent Application No. 2015-016477 filed 30 Jan. 2015, the disclosures of which are incorporated herein by reference in their entirety.

TECHNICAL FIELD

The present disclosure relates to a solid state imaging device and an electronic device, more particularly, to a solid state imaging device and an electronic device from which a holding unit for holding information in a pixel can be eliminated.

BACKGROUND ART

Conventional time of flight (TOF) basically includes a pixel having four ports for acquiring background light, reflection light 1, and reflection light 2, and for an OFG releasing electrical charge, or two ports for calculation of subtraction of background light in the pixel (see Patent Document 1).

CITATION LIST

Patent Document

Patent Document 1: Japanese Patent Application Laid-Open No. 2012-217058

SUMMARY OF THE INVENTION

Problems to be Solved by the Invention

Thus, although distance measurement light (mainly IR) is input to whole pixels, the distance measurement light is read linearly sequentially, and light emission is required for each column each time, or an analog memory is required to hold information in a pixel.

The present disclosure has been made in view of such circumferences, and is configured to eliminate a holding unit for holding information in a pixel.

Solutions to Problems

A solid state imaging device according to one aspect of the present technology includes, for each pixel, one light receiving unit receiving light input to a pixel for photoelectrical conversion, a dividing unit dividing a pixel signal from the light receiving unit, for allocation, and at least two AD converters each converting each pixel signal divided for allocation by the dividing unit, to a digital signal.

The divided pixel signals for allocation are subjected to A/D conversion in terms of signal level, on the basis of any of at least two kinds of conversion efficiencies.

Emission timing of IR light from outside is controlled to divide a pixel signal representing reflection light resulting from reflection of the IR light received by the light receiving unit into at least two for allocation, by the dividing unit.

The dividing unit can divide a pixel signal from the light receiving unit into four, for allocation.

The dividing unit can divide a pixel signal from the light receiving unit, for application to three AD converters and one discharge unit.

An in-phase component removal unit is provided for each pixel to remove an in-phase component from a pixel signal from the light receiving unit, and the dividing unit can divide a pixel signal from the light receiving unit into two, for allocation.

The A/D converter includes a comparison unit comparing a pixel signal from the light receiving unit and a reference signal for comparison with the pixel signal to output a comparison result, and a storage unit storing a signal upon reversal of a comparison result from the comparison unit, as a digital value.

The storage unit has a dynamic latch.

The storage unit has a static latch.

The storage unit has an up-down counter.

The solid state imaging device includes a plurality of semiconductor substrates.

The pixels are a backside-illuminated pixel unit.

The dividing unit may include a transfer transistor.

The dividing unit may divide a pixel signal from the light receiving unit by time division, for allocation.

An electronic device according to one aspect of the present technology includes a solid state imaging device including, for each pixel, one light receiving unit receiving light input to a pixel for photoelectrical conversion, a dividing unit dividing a pixel signal from the light receiving unit, for allocation, and at least two AD converters each converting each pixel signal divided for allocation by the dividing unit to a digital signal. The electronic device further includes a signal processing circuit processing an output signal output from the solid state imaging device, and an optical system inputting incident light to the solid state imaging device.

According to one aspect of the present technology, a pixel signal is divided for allocation, which is obtained by photoelectric conversion of received light input to a pixel. Then, the allocated pixel signals are input to at least two AD converters.

Effects of the Invention

According to the present technology, a holding unit for holding information in a pixel is eliminated.

Note that the effects described in the present description are by way of examples only, and the effects of the present technology are not limited to the effects described in the present description, and other effects may be added.

MODE FOR CARRYING OUT THE INVENTION

A mode for carrying out the present disclosure (hereinafter, referred to as embodiment) will be described below. Note that the description will be given in the following order.

1. First embodiment (configuration of pixel unit)
2. Second embodiment (configuration of pixel unit)
3. Third embodiment (configuration of pixel unit)
4. Fourth embodiment (configuration of latch unit)
5. Fifth embodiment (configuration of latch unit)
6. Sixth embodiment (multiple substrate configuration)
7. Examples of use of image sensor
8. Examples of application to electronic device 1. First Embodiment <Exemplary Schematic Configuration of Solid State Imaging Device>

Figure 1:
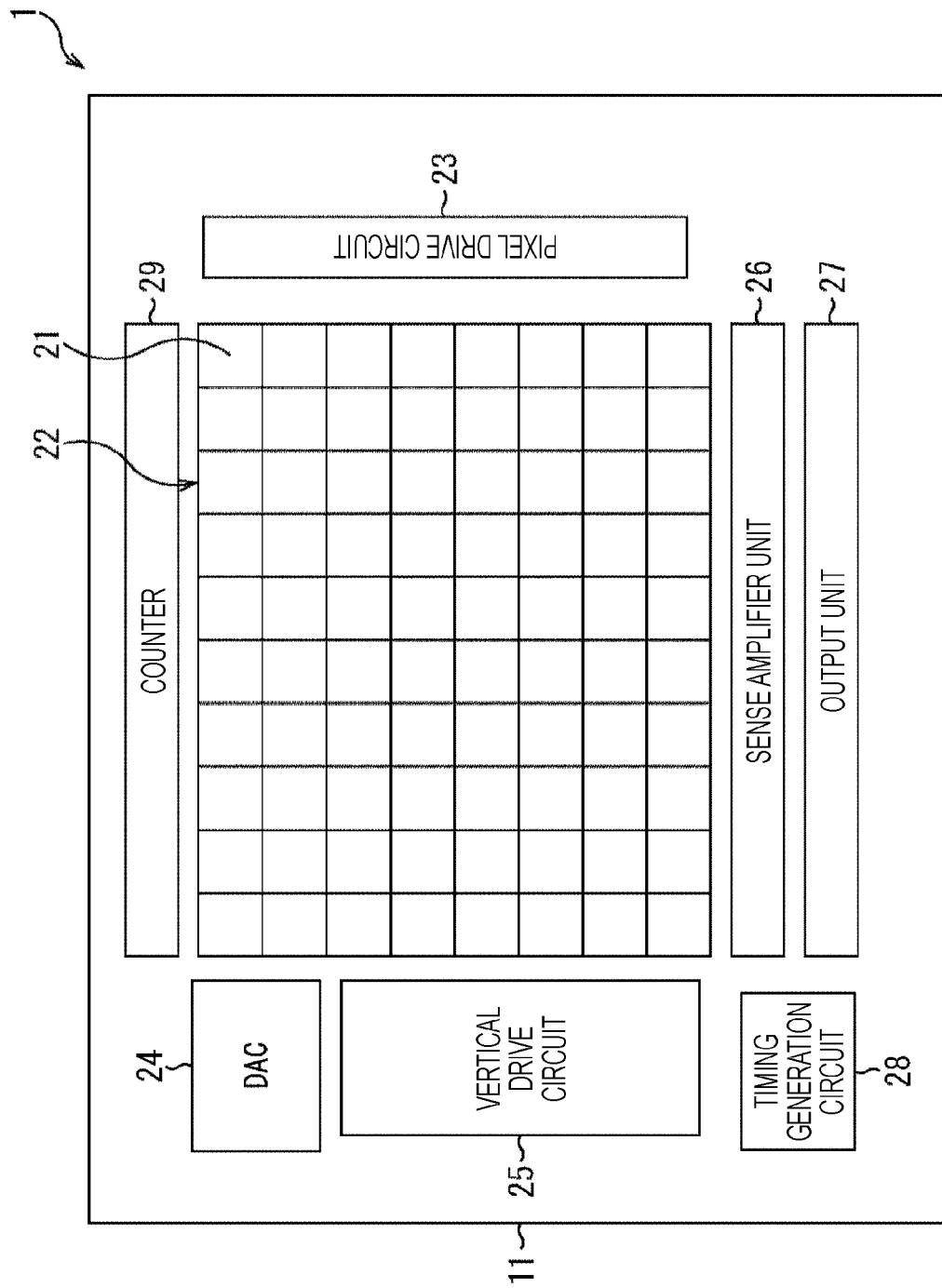
FIG. 1 is a block diagram illustrating an exemplary schematic configuration of a solid state imaging device to which the present technology is applied.

FIG. 1 illustrates a schematic configuration a solid state imaging device according to the present disclosure.

The solid state imaging device 1 of FIG. 1 includes a pixel array portion 22 having pixels 21 arranged in a two-dimensional array, on a semiconductor substrate 11 including for example silicon (Si) as a semiconductor. Then, around the pixel array portion 22 on the semiconductor substrate 11, a pixel drive circuit 23, a D/A converter (DAC) 24, a vertical drive circuit 25, a sense amplifier unit 26, an output unit 27, a timing generation circuit 28, and a counter 29 are formed.

Figure 2:
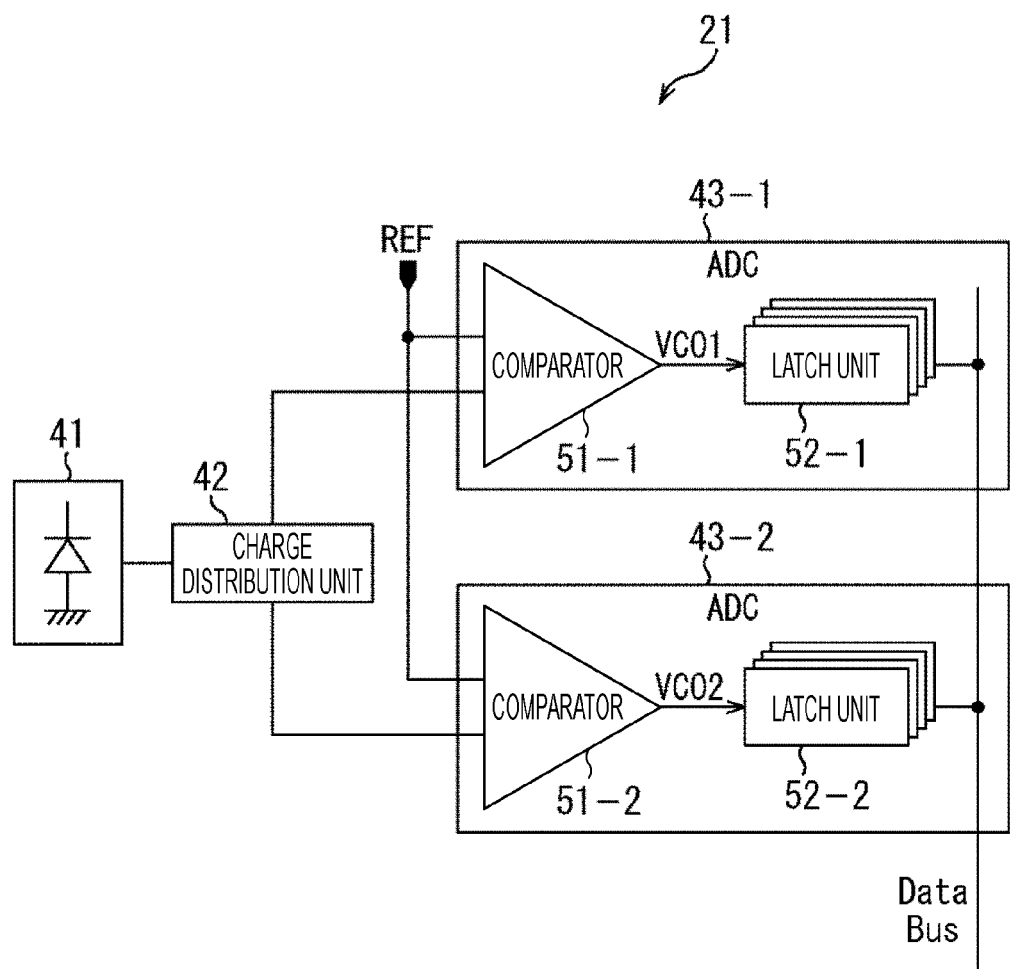
FIG. 2 is a circuit diagram illustrating a pixel according to a first embodiment.

As illustrated in FIG. 2, a pixel (hereinafter, referred to as pixel unit) 21 internally includes a pixel circuit 41, a charge distribution unit 42, and AD converters (ADC) 43-1 and 43-2. Note that, FIG. 2 illustrates an example of division of a signal into two for allocation.

The pixel circuit 41 includes a photoelectric converter cumulatively generating an electrical charge signal according to an amount of light received, and outputs an analog pixel signal SIG acquired from the photoelectric converter to the charge distribution unit 42. The charge distribution unit 42 distributes and outputs a pixel signal SIG from the pixel circuit 41 to the plurality of ADCS 43-1 and 43-2. Each of the ADCS 43-1 and 43-2 converts an analog pixel signal SIG supplied from the charge distribution unit 42 to a digital signal.

The ADC 43-1 includes a comparator 51-1 and a latch unit 52-1. The ADC 43-2 includes a comparator 51-2 and a latch unit 52-2. Note that, in a case where there is no need to distinguish between the ADCS 43-1 and 43-2, the comparators 51-1 and 51-2, or the latch units 52-1 and 52-2, they are collectively called ADC 43, comparator 51, or latch unit 52.

The comparator 51 compares a reference signal REF input from the DAC 24 and a pixel signal SIG input from the charge distribution unit 42, and outputs an output signal VCO as a signal representing a comparison result. When a reference signal REF and a pixel signal SIG are the same (voltage) as each other, the comparator 51 inverts an output signal VCO.

Into the latch unit 52, a code value BITXn (n=1 or an integer of N) representing time at which an output signal VCO is inverted is input as an input signal. Furthermore, latch unit 52 includes a terminal to which a counter signal is supplied from the counter 29. Then, in the latch unit 52, a code value BITXn obtained upon inversion of an output signal VCO from the comparator 51 is held, and then is read as an output signal Coln. Therefore, the ADC 43 outputs a digital value obtained by digitalizing an analog pixel signal SIG by an N bit. Note that detailed description of the code value BITXn and the output signal Coln will be made later in description of FIG. 12.

Note that, in the example of FIG. 2, an exemplary configuration of the ADC 43 including the comparator 51 and the latch unit 52 is illustrated, but the ADC 43 may include a plurality of comparators 51 and latch units 52, including charge distribution units 42.

The pixel drive circuit 23 of FIG. 1 drives the pixel circuit 41 and the comparator 51 in each pixel 21. The DAC 24 generates a reference signal REF as a slope signal representing monotonous decrease of voltage with time, and supplies the slope signal to each pixel 21. The vertical drive circuit 25 outputs digital pixel signals SIG generated in the pixels 21 to the sense amplifier unit 26 in a predetermined order, on the basis of a timing signal supplied from the timing generation circuit 28. A digital pixel signal SIG output from a pixel 21 is amplified by the sense amplifier unit 26, and output from the output unit 27 to the outside from the solid state imaging device 1. Note that, in a case where a data bus has, for example, a signal transfer circuit, the sense amplifier unit 26 is not required for this configuration.

The output unit 27 performs predetermined digital signal processing such as black level correction for correcting black level, or correlated double sampling (CDS), as required, and then outputs the pixel signal SIG to the outside. The timing generation circuit 28 includes a timing generator generating various timing signals, and the like, and supplies generated various timing signals to the pixel drive circuit 23, the DAC 24, the vertical drive circuit 25, and the like. The counter 29 performs counting, and transmits a counter signal to the pixel 21.

The solid state imaging device 1 can be constituted as described above. Note that, in FIG. 1, all circuits constituting the solid state imaging device 1 are formed on one semiconductor substrate 11, as described above, but the circuits constituting the solid state imaging device 1 may be disposed on a plurality of semiconductor substrates 11, as described later.

Furthermore, the solid state imaging device 1 also has a time of flight (TOF) function, and thus can perform distance measurement. The solid state imaging device 1 includes an IR emission unit and an IR emission control unit, which are not illustrated, and IR light is emitted at predetermined timing for distance measurement. Note that the IR emission unit and the IR emission control unit may be provided outside the solid state imaging device 1.

<Example of Driving>

Figure 3:
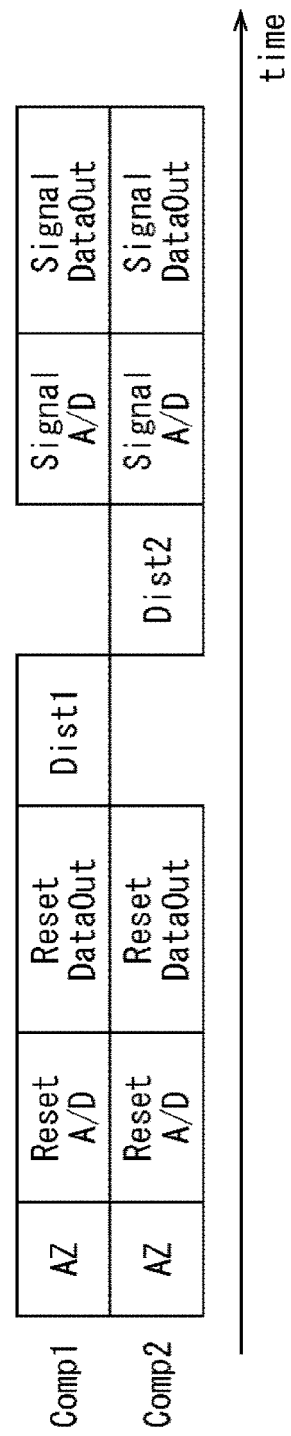
FIG. 3 is a diagram illustrating operation of the pixel according to the first embodiment.

FIG. 3 is a diagram illustrating an example of driving of the pixel unit of FIG. 2 upon dividing a pixel signal for allocation. In the example of FIG. 3, Comp1 represents driving of the charge distribution unit 42 and the ADC 43-1, and Comp2 represents driving of the charge distribution unit 42 and the ADC 43-2.

On the basis of a reset signal from outside, auto zero (AZ) is performed for offset of the comparators 51-1 and 51-2 or random noise memory of the ADC 43-1 and the ADC 43-2, which is represented as AZ. The ADCS 43-1 and 43-2 each perform A/D conversion on a reset signal, which is represented as Reset A/D. That is, each of counter signals from outside (counter 29) is stored in the latch units 52-1 and 52-2.

Then, latch signals stored in the latch units 52-1 and 52-2 are sequentially output to the outside through the data bus, which is represented as Reset DataOut. Here, the reset signal is simultaneously acquired by all pixels.

Next, the charge distribution unit 42 distributes (divides) a pixel signal SIG to the ADC 43-1, which is represented as Dist1, and then, the charge distribution unit 42 distributes the pixel signal SIG to the ADC 43-2, which is represented as Dist2. In the charge distribution unit 42, for example, a signal synchronized on the outside for each color, normal light, and IR+normal light are distributed by time division.

Then, the ADCS 43-1 and 43-2 perform A/D conversion on the distributed pixel signals, which is represented as Signal A/D. That is, each of the distributed pixel signals is stored in the latch units 52-1 and 52-2. Then, pixel signals stored in the latch units 52-1 and 52-2 are sequentially output to the outside through the data bus, which is represented as Signal DataOut.

Note that, although detailed description will be made later, here, the charge distribution unit 42 performs not only distribution, but also release operation of unnecessary electrical charge, removal of an in-phase signal, or the like, depending on a configuration.

Furthermore, in the division for allocation by this driving, Comp1 represents signals accumulated for a long time from the end of Dist2 to the end of Dist1, and Comp2 represents signals accumulated for a long time from the end of Dist1 to the end of Dist2, but electrical charge conversion efficiency after division for allocation (charge to voltage conversion) can be changed to further increase a dynamic range.

<Example of Driving Upon Distance Measurement>

Figure 4:
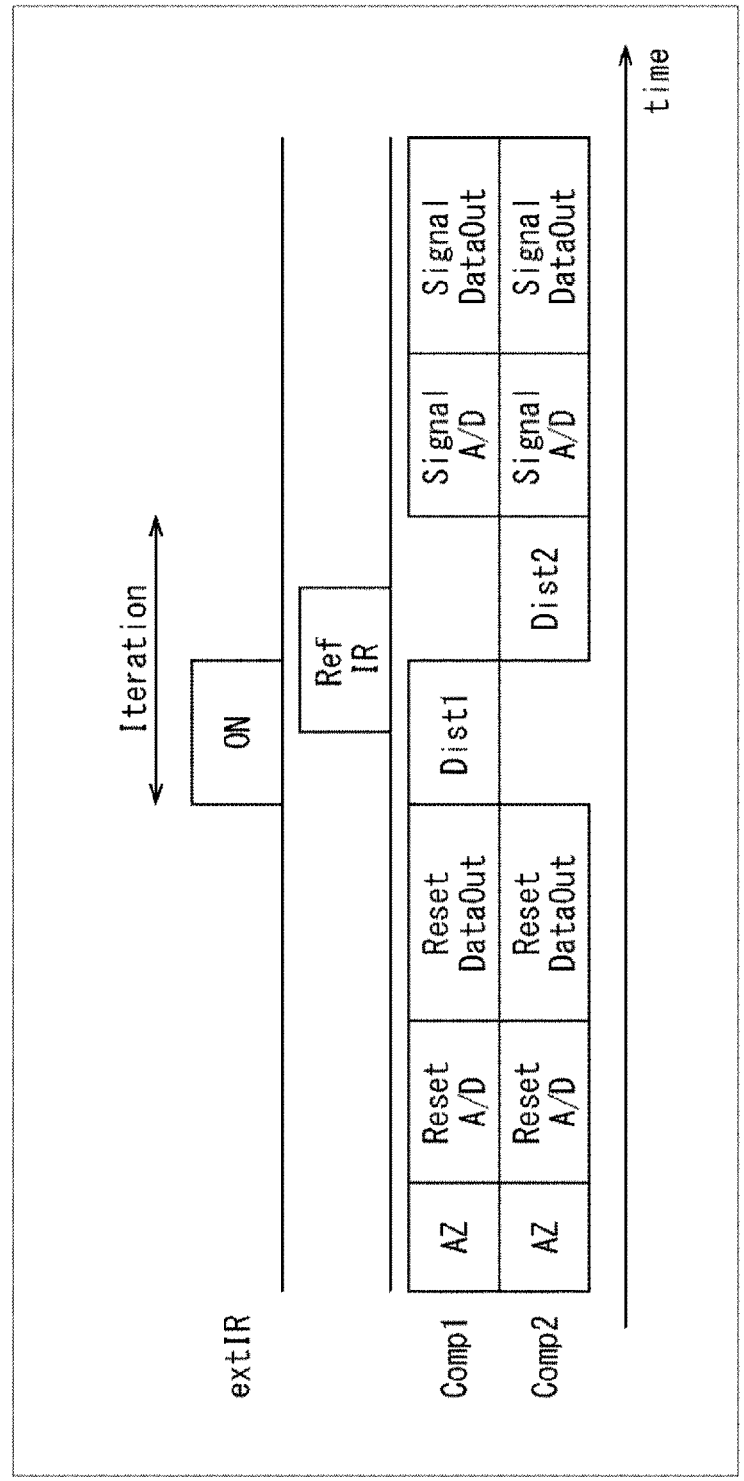
FIG. 4 is a diagram illustrating operation of the pixel according to the first embodiment upon distance measurement.

FIG. 4 is a diagram illustrating an example of driving of the pixel unit of FIG. 2 upon distance measurement. The solid state imaging device 1 has a time of flight (TOF) function, and can also perform distance measurement, in addition to signal division for allocation. Note that, the example of driving illustrated in FIG. 4 is different from the example of driving illustrated in FIG. 3, only in repetition of signal division for allocation by the charge distribution unit 42, and otherwise, drive timing is basically the same as that of the example of driving illustrated in FIG. 3.

That is, IR light from outside is emitted simultaneously with division timing for allocation to the ADC 43-1 (Comp1), which is represented as ON. That is, emission timing of IR right from outside is controlled to divide electrical charge of reflected IR light into at least two, for allocation. Note that, in the example of FIG. 4, emission of IR light is performed simultaneously with the division for allocation, but is not limited thereto, and may be performed slightly after the division for allocation. Reflection light resulting from reflection of the IR light emitted is received by the photoelectric converter of the pixel circuit 41, which is represented as Ref IR. In this condition, reception of the reflection light is performed in the second half of division for allocation to the ADC 43-1 (Comp1) and in the first half of division for allocation to the ADC 43-2 (Comp2). The received reflection light is substantially divided into halves for allocation, but a slightly larger half may be allocated to any of the first half and the second half.

Thus, when the charge distribution unit 42 distributes (divides) a pixel signal SIG to the ADC 43-1, which is represented as Dist1, a pixel signal representing background light and reflection light (partial) is divided for allocation to the ADC 43-1. Furthermore, when the charge distribution unit 42 distributes (divides) a pixel signal SIG to the ADC 43-2, which is represented as Dist2, a pixel signal representing background light and reflection light (the rest) is divided for allocation to the ADC 43-2. Note that, as indicated by an arrow Iteration (repetition), the emission of IR light and division for allocation are repeated at least once.

Figure 5:
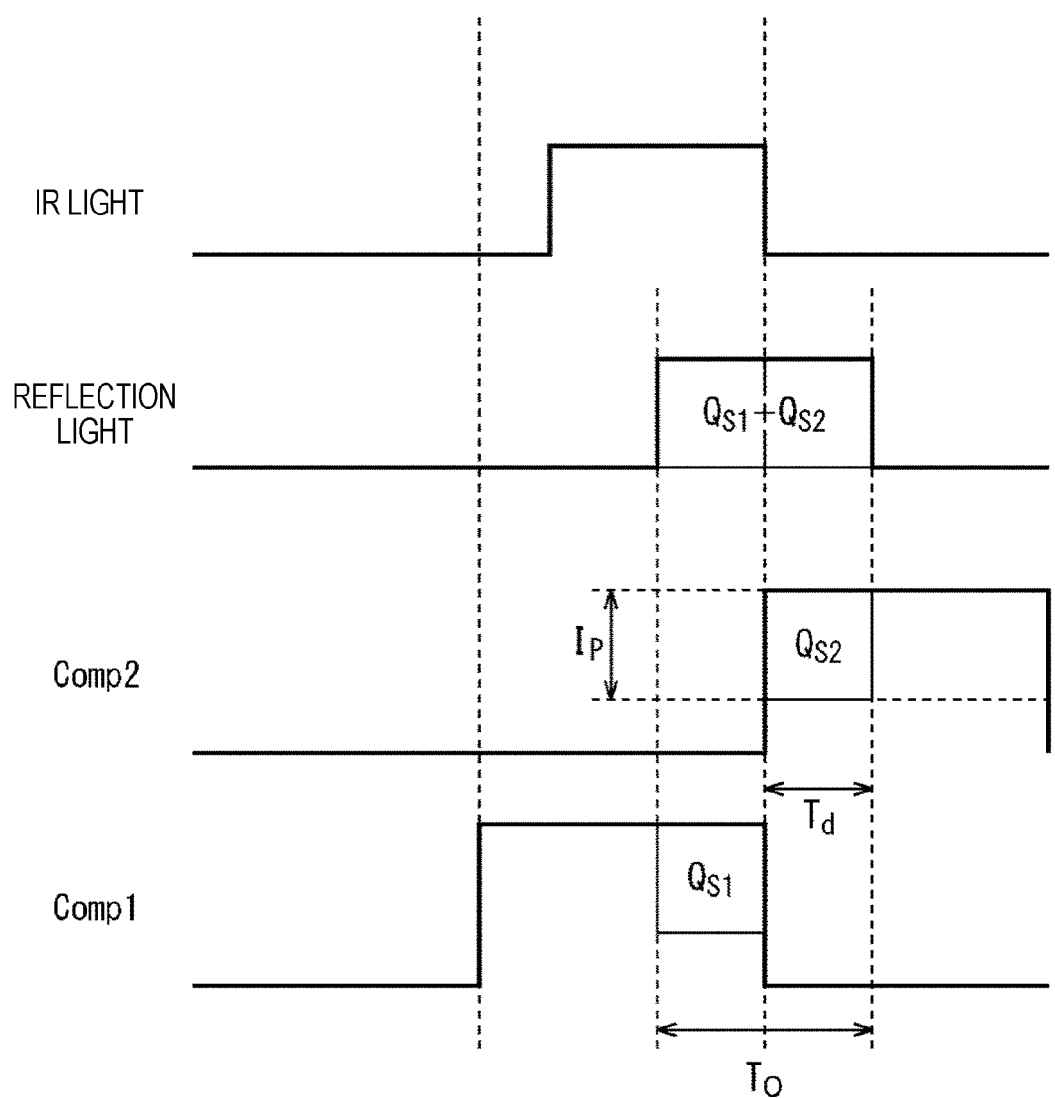
FIG. 5 is a diagram illustrating distance measurement calculation.

As illustrated in FIG. 5, when a delay time in which reflection light cannot be received by the ADC 43-1 (Comp1) during a reflection light receiving time $T_o$, is a delay time $T_d$, photocurrent to the ADC 43-2 (Comp2) is photocurrent $I_p$, electrical charge to the ADC 43-1 (Comp1) is electrical charge $Q_{S1}$, and electrical charge to the ADC 43-2 (Comp2) is electrical charge $Q_{S2}$.

Note that, in an example of FIG. 5, background light is captured beforehand, and is subtracted from each Q.

The electrical charge $Q_2$ to the ADC 43-2 (Comp2) is expressed by the following formula (1), and the electrical charge $Q_1$ to the ADC 43-1 (Comp1) is expressed by the following formula (2). Then, the delay time $T_d$ is expressed by the following formula (3).

[Mathematical Formula 1]
$$Q_2 = Q_{S2} = I_P T_d \tag{1}$$

[Mathematical Formula 2]
$$Q_1 = Q_{S1} = I_P(T_O - T_d) \tag{2}$$

[Mathematical Formula 3]
$$T_d = T_O\left(\frac{Q_2}{Q_2 + Q_1}\right) \tag{3}$$

A value twice a light path length L is given by high speed C×time T, and the light path length L can be determine by the following formula (4).

[Mathematical Formula 4]
$$L = \frac{c}{2}T_d \tag{4}$$

$$= \frac{c}{2} T_O \left( \frac{Q_2}{Q_2 + Q_1} \right)$$

As described above, an amount of electrical charge obtained from reflection light is determined by calculation, and a distance to an object can be determined.

2. Second Embodiment

<Exemplary Configuration of Pixel>

Figure 6:
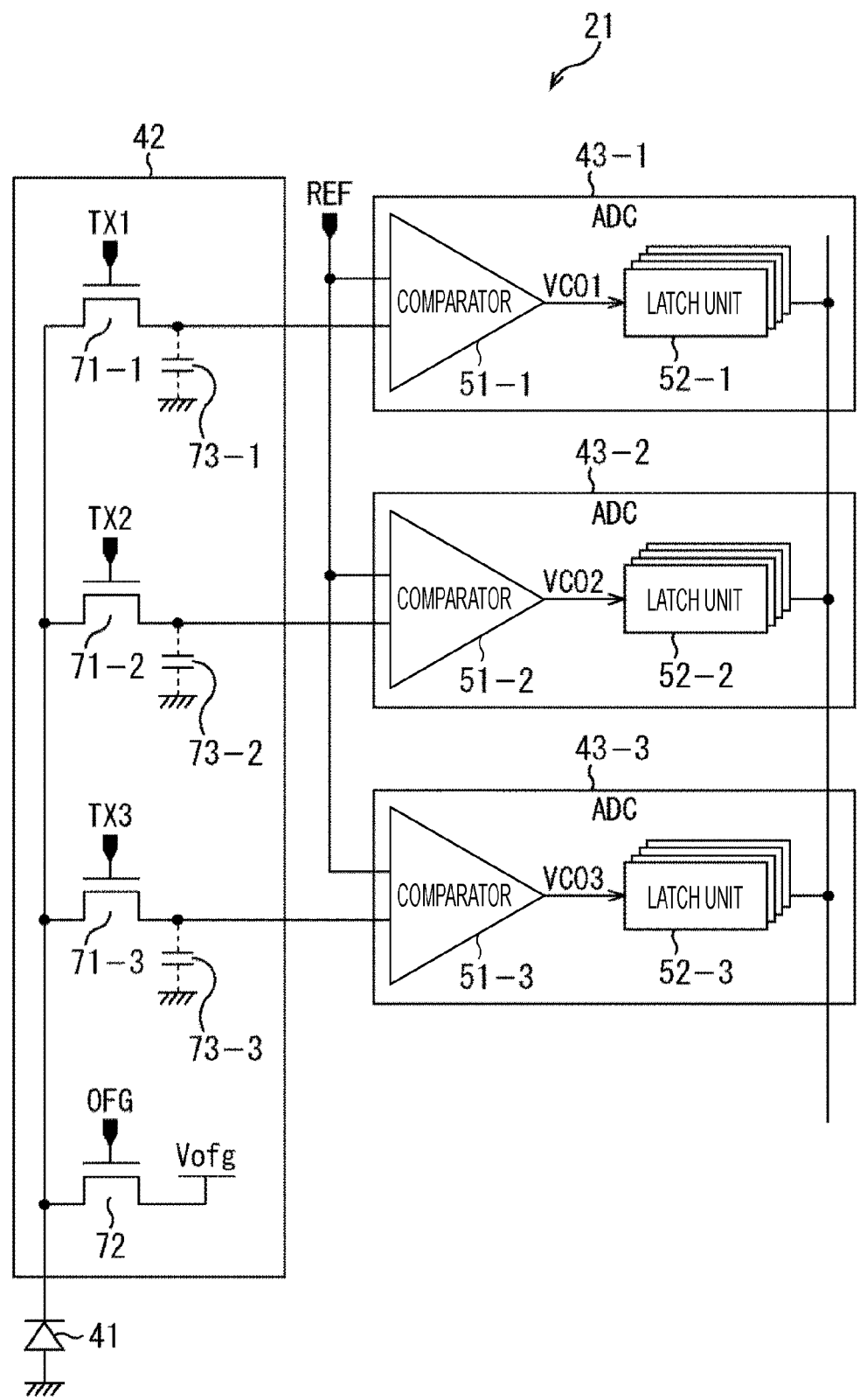
FIG. 6 is a circuit diagram illustrating a pixel according to a second embodiment.

FIG. 6 is a diagram illustrating an exemplary configuration of a pixel. FIG. 6 illustrates an example of division of a signal into four for allocation.

In the example of FIG. 6, the pixel 21 includes a pixel circuit 41, a charge distribution unit 42, and three ADCS 43-1 to 43-3. Note that, in the example of FIG. 6, the charge distribution unit 42 has a configuration different from that in the example of FIG. 2.

The charge distribution unit 42 of FIG. 6 divides a signal for allocation to four ports, that is, three ports for the ADCS 43-1 to 43-3, and one port for release of electrical charge.

That is, the charge distribution unit 42 includes transfer transistors 71-1 to 71-3, a discharge transistor 72, and floating diffusions (FD: charge-voltage converter) 73-1 to 73-3. Note that, in a case where there is no need to distinguish between the transfer transistors 71-1 to 71-3, they are collectively called transfer transistor 71. Furthermore, in a case where there is no need to distinguish between the FDS 73-1 to 73-3 from each other, they are collectively called FD 73.

Sources of the transfer transistors 71-1 to 71-3, and the discharge transistor 72 are connected to the pixel circuit 41. Into gates of the transfer transistors 71-1 to 71-3, transfer signals TX1 to TX3 are respectively input. Drains of the transfer transistors 71-1 to 71-3 are respectively connected to comparators 51-1 to 51-3 of the ADCS 43-1 to 43-3.

Into a gate of the discharge transistor 72, a discharge signal OFG is input. A drain of the discharge transistor 72 is connected to voltage Vofg.

FDS 73-1 to 73-3 are connected to connection points between the transfer transistors 71-1 to 71-3 and the ADCS 43-1 to 43-3.

Note that, in the example of FIG. 6, the transfer transistor 71 is illustrated, but is not limited to a transistor, as long as a transfer unit is employed.

<Example of Driving Upon Distance Measurement>

Figure 7:
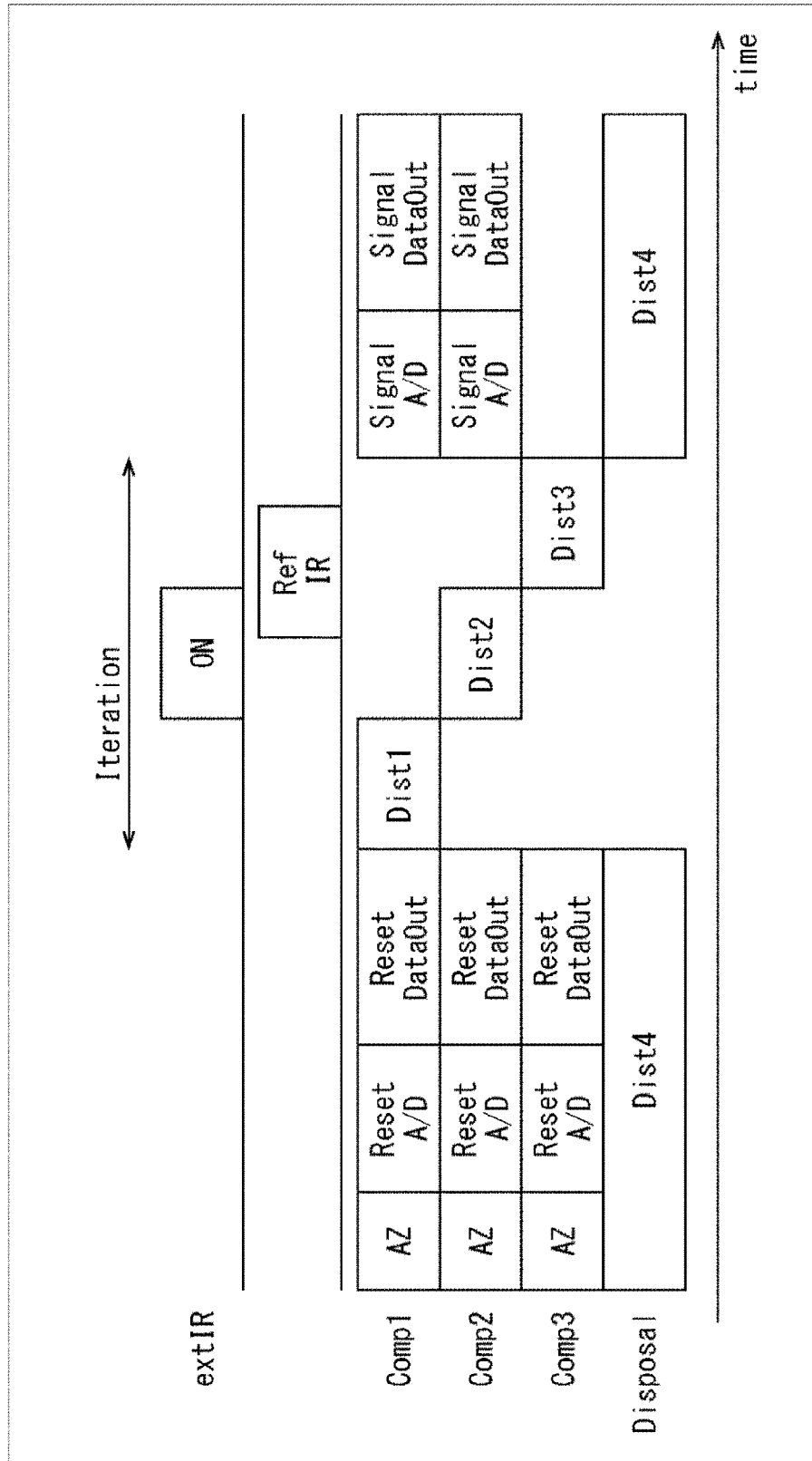
FIG. 7 is a diagram illustrating operation of the pixel according to the second embodiment upon distance measurement.

FIG. 7 is a diagram illustrating an example of driving of the pixel unit of FIG. 2 upon distance measurement. In the example of FIG. 7, Comp1 represents driving of the transfer transistor 71-1, the FD 73-1, and the ADC 43-1. Comp2 represents driving of the transfer transistor 71-2, the FD 73-2, and the ADC 43-2. Com3 represents driving of the transfer transistor 71-3, the FD 73-3, and the ADC 43-3. Furthermore, Desposal represents driving of the discharge transistor 72.

On the basis of a reset signal from outside, auto zero (AZ) is performed for reset of the FDS 73-1 to 73-3, offset of the comparators 51-1 to 51-3, or random noise memory of the ADC 43-1 to the ADC 43-3, which is represented as AZ. The ADCS 43-1 to 43-3 each perform A/D conversion on a reset signal, which is represented as Reset A/D. That is, each of counter signals is stored in the latch units 52-1 to 52-3.

Then, each of latch signals stored in the latch units 52-1 and 52-2 is sequentially output to the outside through a data bus, which is represented as Reset DataOut. Here, the reset signal is simultaneously acquired by all pixels.

Next, the charge distribution unit 42 distributes (divides) a pixel signal SIG to the ADC 43-1, which is represented as Dist1, and then, the charge distribution unit 42 distributes the pixel signal SIG to the ADC 43-2, which is represented as Dist2, and further, the charge distribution unit 42 distributes the pixel signal SIG to the ADC 43-3, which is represented as Dist3.

In this condition, after waiting for a period for acquiring IR light, as long as a period for acquiring background light, from division timing for allocation to the ADC 43-1 (Comp1), IR light from outside is emitted simultaneously with or slightly later than division timing for allocation to the ADC 43-2 (Comp2), which is represented as ON. Reflection light resulting from reflection of the IR light emitted is received by the photoelectric converter of the pixel circuit 41, which is represented as Ref IR. In this condition, reception of the reflection light is performed in the second half of division for allocation to the ADC 43-2 (Comp2) and in the first half of division for allocation to the ADC 43-3 (Com3).

Thus, when the charge distribution unit 42 distributes (divides) a pixel signal SIG to the ADC 43-1, which is represented as Dist1, a pixel signal representing only background light is divided for allocation to the ADC 43-1. When the charge distribution unit 42 distributes (divides) a pixel signal SIG to the ADC 43-2, which is represented as Dist2, a pixel signal representing background light and reflection light (partial) is divided for allocation to the ADC 43-2. Furthermore, when the charge distribution unit 42 distributes (divides) a pixel signal SIG to the ADC 43-3, which is represented as Dist3, a pixel signal representing background light and reflection light (the rest) is divided for allocation to the ADC 43-3.

Note that, as indicated by an arrow Iteration (repetition), the emission of IR light and division for allocation are repeated at least once. Furthermore, during a period other than a period indicated by the arrow Iteration (repetition), in which no signal is acquired, the discharge transistor 72 functions as an overflow portion for releasing electrical charge, which is represented as Dist4.

As described above with reference to FIG. 5, the above configuration enables acquisition of distance measurement data from reflection light, and subtraction of background light being an error component in a distance estimation signal, from output from the ADC 43-1 (Comp1).

Figure 8:
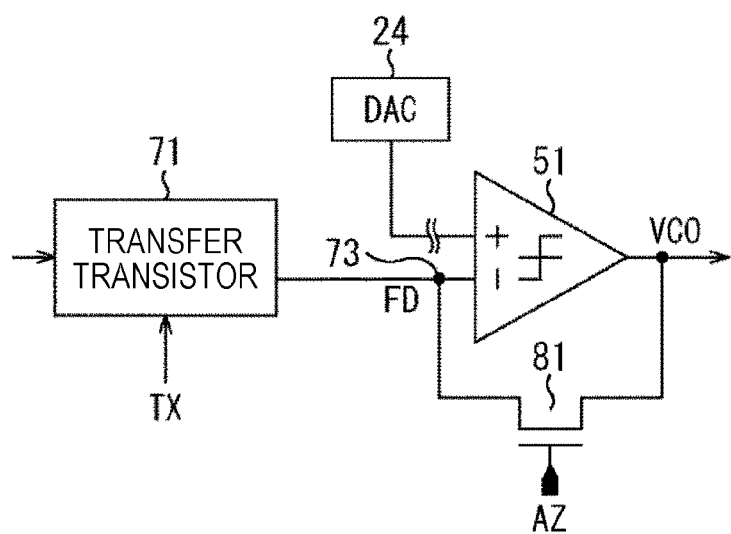
FIG. 8 is a detailed circuit diagram illustrating a comparator and surroundings thereof in the pixel according to the second embodiment.

FIG. 8 is a detailed circuit diagram illustrating a comparator 51 of FIG. 6 and surroundings thereof.

In an example of FIG. 8, into the comparator 51, a reference signal REF supplied from a DAC 24 and a pixel signal SIG supplied from the charge distribution unit 42 (transfer transistor 71) are input.

An output signal VCO from a comparator 51 is output to a latch unit 52 and a source of a reset transistor 81. Into a gate of the reset transistor 81, a reset signal AZ is input. A drain of the reset transistor 81 is connected to an FD 73 provided at a connection point between the transfer transistor 71 and the comparator 51. In the reset transistor 81, when the reset signal AZ is input to the gate, auto zero is performed for offset of the FD 73 and the comparator 51 or random noise memory of the ADC 43, and the reset signal is subjected to A/D conversion by the ADC 43.

Figure 9:
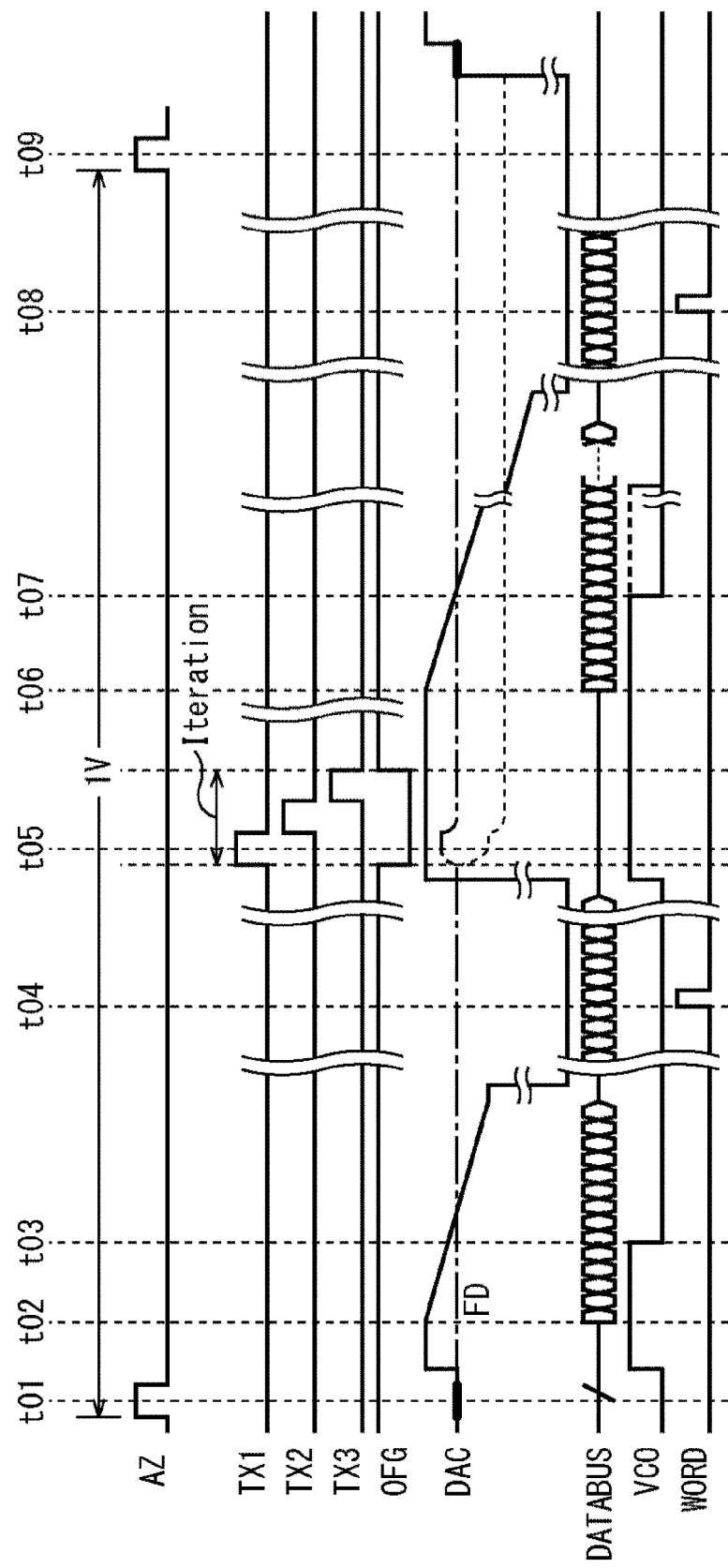
FIG. 9 is a timing chart illustrating operation of the pixel according to the second embodiment.

FIG. 9 is a chart illustrating a control waveform of the pixel 21 of FIG. 6. FIG. 9 illustrates an example of a timing chart in one vertical signal interval (1V).

AZ represents a control waveform of a reset signal AZ. TX1 to TX3 represent control waveforms of transfer signals TX1 to TX3 input to the transfer transistors 71-1 to 71-3. OFG represents a control waveform OFG of a discharge signal input to the discharge transistor 72.

DAC represents a voltage waveform of a reference signal input from a DAC 24. FD overlapping DAC represents a voltage waveform of a pixel signal through an FD. Note that FD has waveforms, that is, an upper waveform (dashed-dotted line) in FIG. 9, representing darkness in which a photodiode in a pixel circuit 41 is not irradiated with light, and a lower waveform (dotted line) in FIG. 9, representing the photodiode in the pixel circuit 41 irradiated with light.

DATABUS represents a code input signal supplied from the data bus, or a code output signal output to the data bus. VCO represents a waveform of an output signal output from a comparator 51. WORD represents a waveform of a read signal input to a latch unit 52.

As indicated by AZ, a reset signal AZ is input to a reset transistor 81 at time t01, and circuits of the FD 73 and an ADC 43 are initialized.

Next, as indicated by DAC, the reference signal from the DAC 24 is raised relative to that upon pixel reset. At time t02, the DAC 24 is prepared, the reference signal from the DAC 24 is reduced, the counter on the outside is operated, and a code input signal (code value) BITXn is supplied to the data bus, as indicated by DATABUS. That is, in the example of FIG. 9, the reference signal is a slope signal having a voltage monotonously decreasing with time. Then, the reset signal is input to the comparator 51, and an output signal VCO is output.

When the pixel signal through the FD and the reference signal are at the same level and then inverted at time t03, p phase (reset level) acquisition is performed, a code value BITXn is held, and the output signal VCO is stopped.

After the output signal VCO is written, in a signal reading period after time t04, a read control signal WORD is input to the latch unit 52. The control signal WORD is Hi at read timing t04, and the control signal WORD is output from the data bus, as p-phase data output and an n-bit latch signal (code output signal) Coln.

Next, at time 05, the DAC 24 is activated, and the reference signal from the DAC 24 is raised relative to that upon pixel reset. The DAC 24 outputs voltage based on supply voltage Vdd as a reference signal REF to the comparator 51. As illustrated in TX1 to TX3, during a period indicated by an arrow interation, division of electrical charge for allocation, described above with reference to FIG. 7, is performed for Dist1 to Dist3, while the transfer signals TX1 to TX3 input to the gates of each of the transfer transistors 71-1 to 71-3 are activated. Note that, as indicated by OFG, during the period indicated by the arrow interation, the discharge transistor 72 falls, and a period other than the period indicated by the arrow interation, a discharge signal OFG input to the gate of the discharge transistor 72 is discharged.

At time 06, the DAC 24 is prepared, the reference signal from the DAC 24 is reduced, the counter 29 on the outside is operated, and a code input signal (code value) BITXn is supplied to the data bus, as indicated by DATABUS.

In this condition, in a case where the photodiode in the pixel circuit 41 is not irradiated with light, a pixel signal through the FD 73 is maintained at a high level as represented by the dashed-dotted line of FIG. 9, and when the reference signal from the DAC 24 is equal to the pixel signal (time t07), the output signal VCO is inverted (transition to LOW). In a case where the photodiode is irradiated with light, the pixel signal through the FD 73 is maintained at the same value at a low level as represented by the dotted line without transition, and is inverted later than the photodiode not irradiated with light.

When the output signal VCO is inverted, D phase (data level) acquisition is performed, a code value BITXn obtained upon inversion of the output signal VCO is held, and the output signal VCO is stopped, in the latch unit 52.

After the output signal VCO is written, in the signal reading period, a read control signal WORD is input to the latch unit 52. The control signal WORD is Hi, at time t08, and an n-bit latch signal LATn in the m-th row is output from the data bus, as a code output signal Coln.

3. Third Embodiment

<Exemplary Configuration of Pixel>

Figure 10:
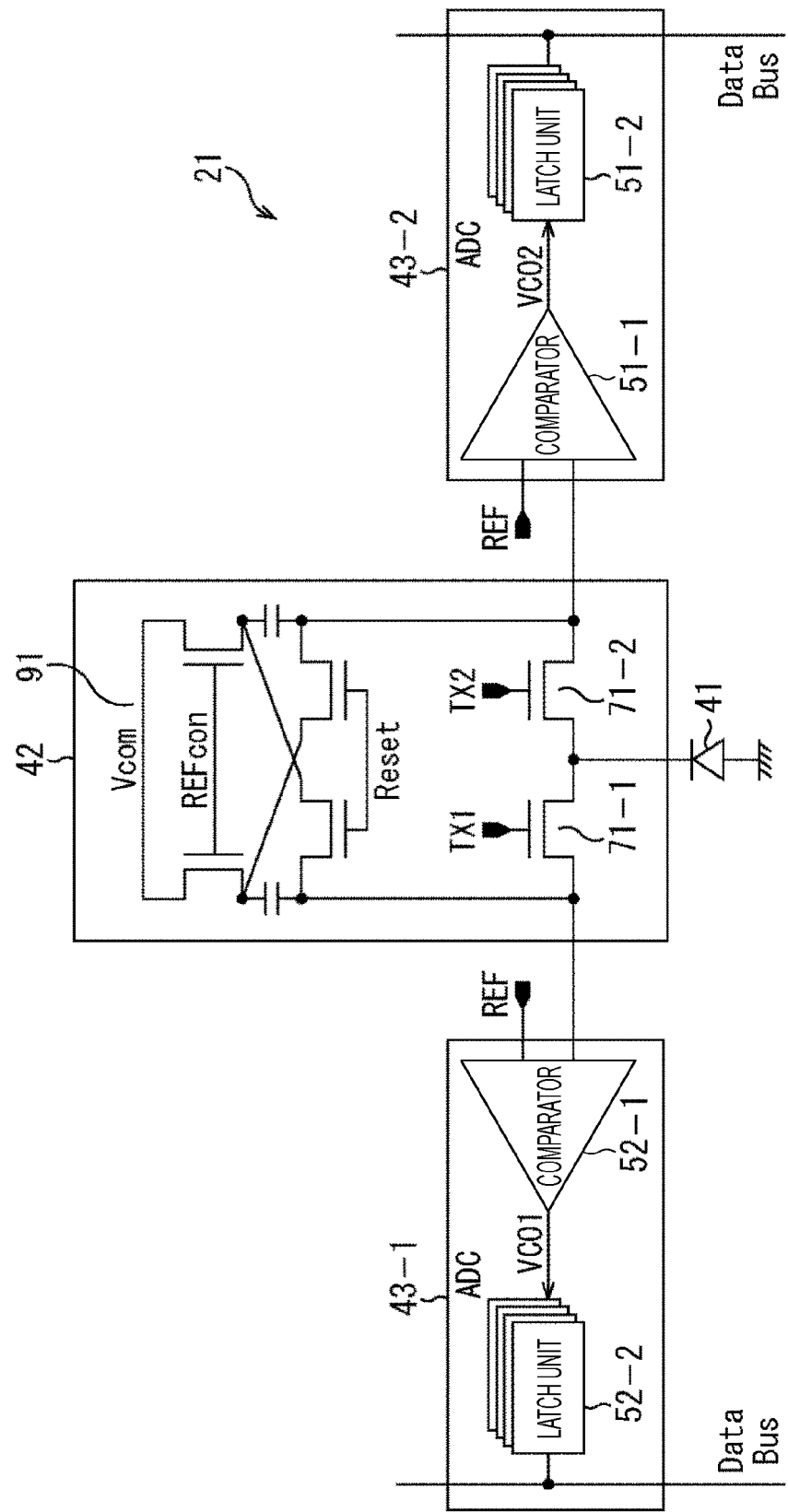
FIG. 10 is a circuit diagram illustrating a pixel according to a third embodiment.

FIG. 10 is a diagram illustrating an exemplary configuration of a pixel. FIG. 10 illustrates an example of division of a signal into two for allocation, and removal of background light as an in-phase signal.

In the example of FIG. 10, a pixel 21 includes a pixel circuit 41, a charge distribution unit 42, and two ADCS 43-1 and 43-2, and repeats modulated exposure (all pixels), offset removal (all pixels), and sequential reading, after reset acquisition. Note that, in the example of FIG. 10, a configuration of the charge distribution unit 42 is different from those of examples of FIGS. 2 and 6.

The charge distribution unit 42 of FIG. 10 includes transfer transistors 71-1 and 71-2 distributing a signal to the ADCS 43-1 and 43-2, respectively, and a background light-removing unit 91.

Into the background light-removing unit 91, a REFcon signal and a Reset signal are input. When the REFcon signal is off and the Reset signal is on, the background light-removing unit 91 cancels (removes) background light as an in-phase signal.

<Example of Driving Upon Distance Measurement>

Figure 11:
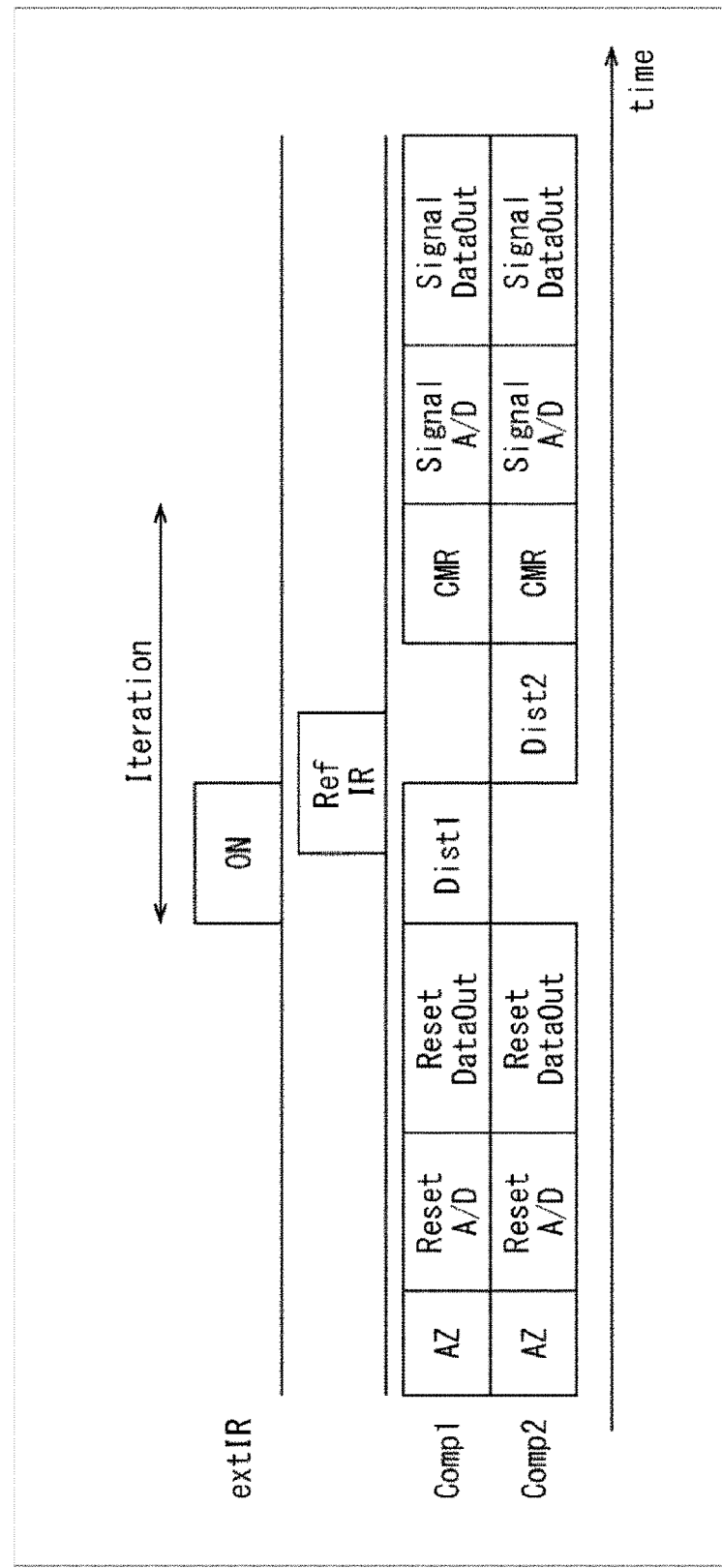
FIG. 11 is a diagram illustrating operation of the pixel according to the third embodiment upon distance measurement.

FIG. 11 is a diagram illustrating an example of driving of the pixel unit of FIG. 10 upon distance measurement. In the example of FIG. 10, Comp1 represents driving of the transfer transistor 71-1, the background light-removing unit 91, and the ADC 43-1. Comp2 represents driving of the transfer transistor 71-2, the background light-removing unit 91, and the ADC 43-2.

On the basis of a reset signal from outside, auto zero (AZ) is performed for offset of the comparators 51-1 to 51-3 or random noise memory of the ADC 43-1 to the ADC 43-3, which is represented as AZ. The ADCS 43-1 to 43-3 each perform A/D conversion on a reset signal, which is represented as Reset A/D. That is, each of counter signals is stored in the latch units 52-1 to 52-3.

Then, each of latch signals stored in the latch units 52-1 and 52-2 is sequentially output to the outside through a data bus, which is represented as Reset DataOut. Here, the reset signal is simultaneously acquired by all pixels.

Next, the charge distribution unit 42 (transfer transistor 71-1) distributes (divides) a pixel signal SIG to the ADC 43-1, which is represented as Dist1. Next, the charge distribution unit 42 (transfer transistor 71-2) distributes a pixel signal SIG to the ADC 43-2, which is represented as Dist2.

In this condition, IR light from outside is emitted simultaneously with or slightly later than division timing for allocation to the ADC 43-1 (Comp1), which is represented as ON. Reflection light resulting from reflection of the IR light emitted is received by the photoelectric converter of the pixel circuit 41, which is represented as Ref IR. In this condition, reception of the reflection light is performed in the second half of division for allocation to the ADC 43-1 (Comp1) and in the first half of division for allocation to the ADC 43-2 (Comp2).

Thus, when the charge distribution unit 42 distributes (divides) a pixel signal SIG to the ADC 43-1, which is represented as Dist1, a pixel signal representing background light and reflection light (partial) is divided for allocation to the ADC 43-1. Furthermore, when the charge distribution unit 42 distributes (divides) a pixel signal SIG to the ADC 43-2, which is represented as Dist2, a pixel signal representing background light and reflection light (the rest) is divided for allocation to the ADC 43-2.

Furthermore, after the signal is divided into the two ADCS for allocation, when the REFcon signal is off and the Reset signal is on, the background light-removing unit 91 is driven to perform in-phase component removal, that is, removal of background light, as common mode rejection (CMR).

Note that, as indicated by an arrow Iteration (repetition), the emission of IR light and division for allocation are repeated at least once, and furthermore the in-phase component removal is also repeated at least once.

As described above with reference to FIG. 5, the above configuration enables acquisition of distance measurement data from reflection light, and removal of background light being an error component in a distance estimation signal, by the background light-removing unit 91.

4. Fourth Embodiment

<Exemplary Configuration of Latch Unit>

Figure 12:
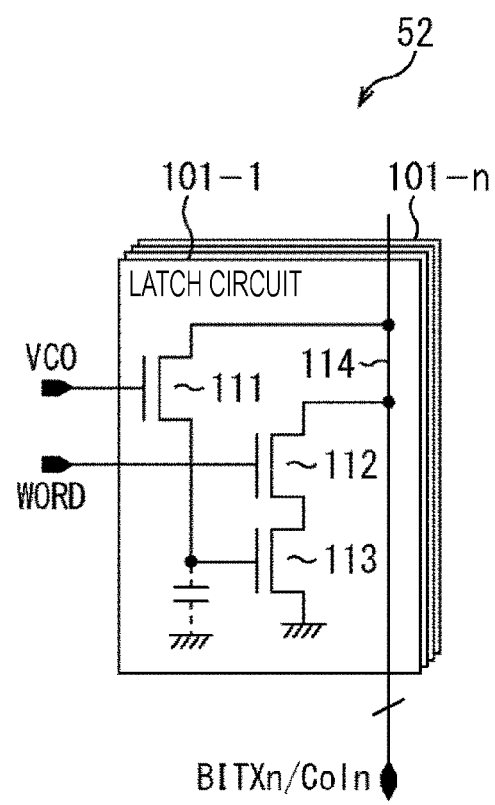
FIG. 12 is a circuit diagram illustrating a configuration of a latch unit.

FIG. 12 illustrates a first exemplary configuration of a latch unit 52.

The latch unit 52 includes, for example, a dynamic latch. The latch unit 52 is provided with N latch circuits (data storage units) 101-1 to 101-N, corresponding to N bits as the number of bits to be A-D converted. Note that, in the following description, in a case where there is no need to particularly distinguish between N latch circuits 101-1 to 101-N, they are merely called latch circuit 101. Note that, from the viewpoint of a CDS circuit, in a case where finally N bit conversion is performed, a circuit having N+1 latches may be employed.

A latch circuit 101 includes transistors 111 to 113, and a latch common input/output line 114. Into a gate of the transistor 111 of each of the N latch circuits 101-1 to 101-N, an output signal VCO from a comparator 51 is input.

A drain of the transistor 111 to which the output signal VCO is input is connected to the latch common input/output line 114 shared with a drain of the transistor 112 to which a control signal WORD is input. A source of the transistor 111 is connected to a connection point between a floating portion grounded and a gate of the transistor 113. A drain of the transistor 113 is connected to a source of the transistor 112, and a source thereof is grounded.

In a latch circuit 101-n for the n-th bit, a code input signal (code value) BITXn of 0 or 1, representing time of corresponding operation, is input to the latch common input/output line 114 The code input signal BITXn is, for example, a bit signal such as gray code. In the latch circuit 101-n, data LATn is stored. The data LATn is obtained upon inversion of the output signal VCO output from the comparator 51 and input to the gate of the transistor 111.

In the latch circuit 101-n for the n-th bit, the read control signal WORD is input to a gate of the transistor 112. At read timing for reading the latch circuit 101-n for the n-th bit, the control signal WORD is Hi, and an n-bit latch signal LATn in the m-th row is output in parallel as a code output signal Coln, from the latch common input/output line 114.

The latch unit 52 is configured as described above, and thus, the ADC 43 can be operated as an integrating AD converter.

Note that, the dynamic latch of FIG. 12 requires a sense amplifier unit 26 and a counter on the outside, for reading.

5. Fifth Embodiment

<Exemplary Configuration of Latch Unit>

Figure 13:
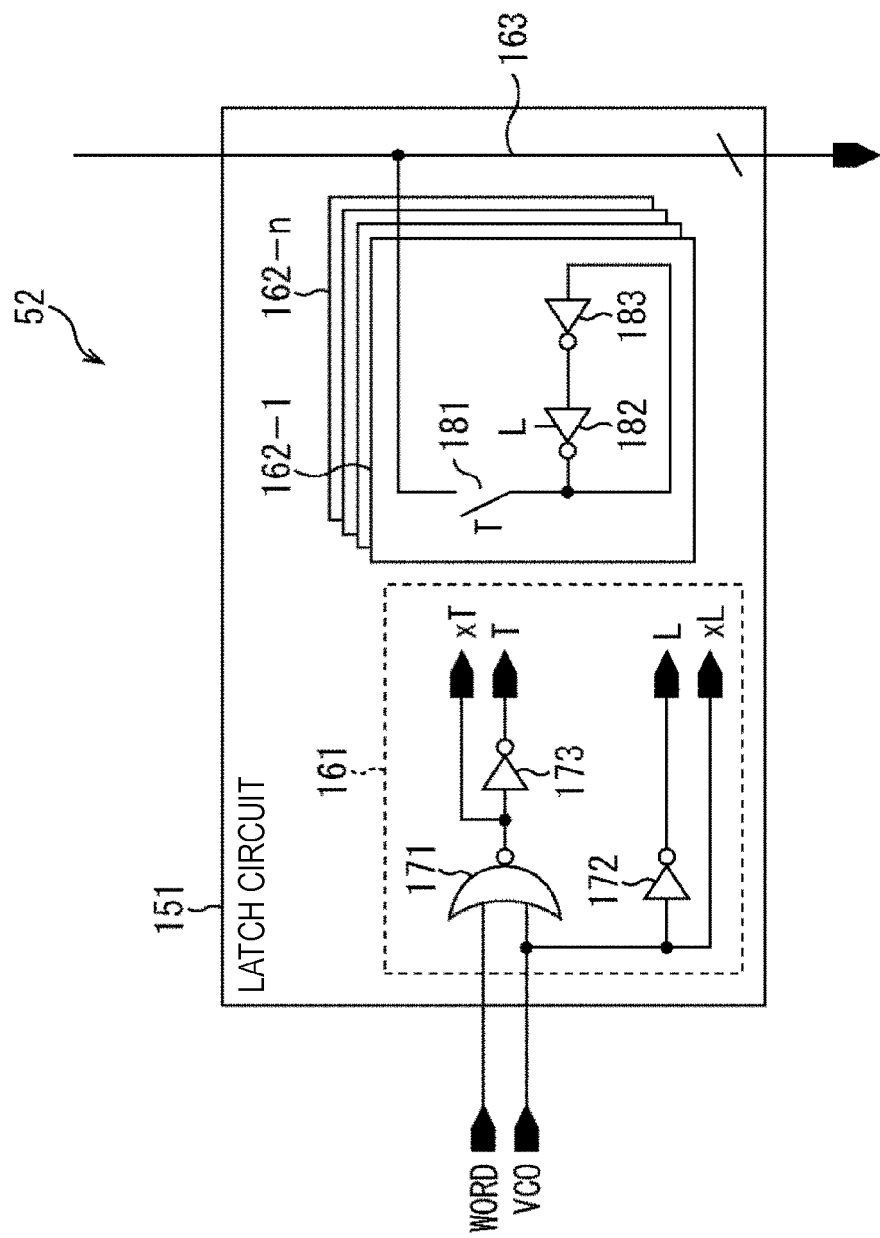
FIG. 13 is a circuit diagram illustrating a configuration of the latch unit.

FIG. 13 illustrates a second exemplary configuration of the latch unit 52.

The latch unit 52 includes a latch circuit 151 being a static latch. The latch circuit 151 includes one multiplexer 161, N static latches 162-1 to 162-N corresponding to N bits as the number of bits to be A-D converted, and a latch common input/output line 163. Note that, in the following description, in a case where there is no need to particularly distinguish between the static latches 162-1 to 162-N, they are merely called static latch 162.

Into the multiplexer 161, an output signal VCO and a control signal WORD are input, and into the static latch 162, a calculation result is input. The multiplexer 161 controls read and write operations from and to the static latch 162.

The multiplexer 161 includes a NOR circuit 171, an inverter 172, and an inverter 173. The output signal VCO is input to the NOR circuit 171, and output as xT being a logical NOR of the output signal VCO and the control signal WORD, and a value inverted by the inverter 172 is output as T. Furthermore, the output signal VCO is output as xL, and a value inverted by the inverter 173 is output as L.

When the control signal WORD is OFF and the output signal VCO is ON, T=ON and L=OFF in the signals from the multiplexer 161, and in the static latch 162, write (retrieval) is performed from the latch common input/output line 163. Furthermore, when the control signal WORD is OFF and the output signal VCO is OFF, T=OFF and L=ON in the signals from the multiplexer 161, and the static latch 162 flips to store data written from the latch common input/output line 163.

Furthermore, when the control signal WORD is ON and the output signal VCO is OFF, T=ON and L=ON in the signals from the multiplexer 161, and data stored in the static latch 162 is read into the latch common input/output line 163. Furthermore, when the control signal WORD is ON and the output signal VCO is ON, T=ON and L=OFF in the signals from the multiplexer 161, and the static latch 162 has a High impedance without influence on the latch common input/output line 163.

As described above, in a case where the latch unit 52 includes a static latch, read and write control is performed in the latch unit 52, and the need for a sense amplifier on the outside is eliminated.

Furthermore, leak resistance, light resistance, and the like of the static latch of FIG. 13 is higher than those of the dynamic latch of FIG. 12. Furthermore, according to a process scaling law, a reduced area (for example, 65 nm or less) is provided in the advanced process.

Note that, in the above description, as a storage unit, the latch has been exemplified, but, for example, an up-down counter operated following a counter may be employed instead of the latch.

According to the present technology, holding units for holding information (simultaneous distance signals for all pixels) in pixels can be eliminated. Thus, the holding units which need to be shielded from light can be eliminated and a most suitable configuration for backside illumination can be provided.

Furthermore, according to the present technology, correlated double sampling (CDS) for foreseeing resetting is allowed, and kT/C (reset noise) can be removed.

6. Sixth Embodiment

<Multiple Substrate Configuration>

In the above description, the solid state imaging device 1 formed on one semiconductor substrate 11 has been described, but the A/D converter according to the present technology preferably includes at least two layers of substrate. Furthermore, the pixel unit may be a front side illuminated pixel unit, but a backside illuminated pixel unit can be effectively employed.

Figure 14:
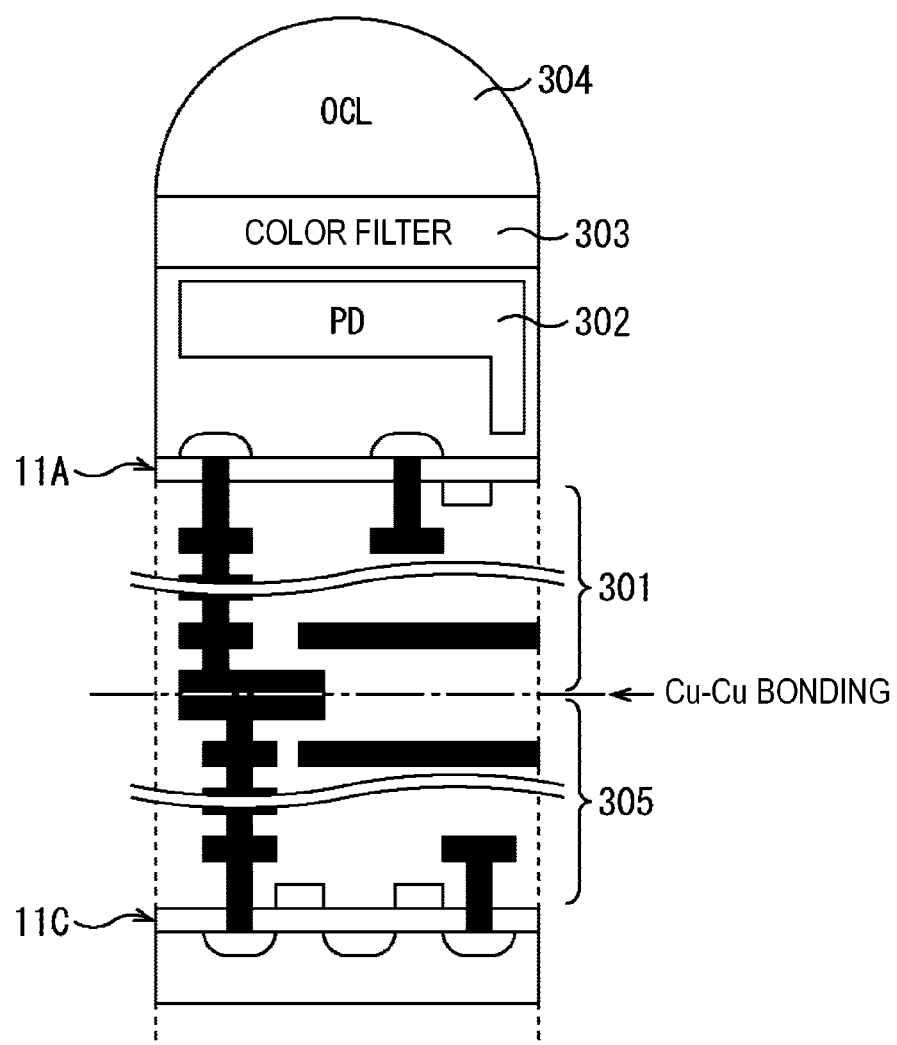
FIG. 14 is a diagram illustrating an exemplary configuration of two semiconductor substrates.

FIG. 14 is a schematic cross-sectional view of a solid state imaging device 1 having two semiconductor substrates 11.

An upper substrate 11A is of a backside illuminated type, in which a photodiode 302, a color filter 303, an on chip lens (OCL) 304, and the like are formed on a back side opposite to a front side on which a wiring layer 301 is formed.

The wiring layer 301 of the upper substrate 11A is bonded to a wiring layer 305 on a front side of a lower substrate 11C, using a bonding technology such as Cu—Cu bonding.

On the upper substrate 11A, for example, at least pixel circuits 41 each including a photodiode 302 are formed. On the lower substrate 11C, at least latch units 52 each including one or more of latch circuits 101 are formed. The upper substrate 11A and the lower substrate 11C are bonded by, for example, metal bonding such as Cu—Cu bonding.

Note that, from the viewpoint of full charge transfer, positional separation is preferably made at a transfer unit (transfer gate) of a charge distribution unit, or a vertical gate is preferably formed by embedding transfer units, but the positional separation may be made at any position basically.

Figure 15:
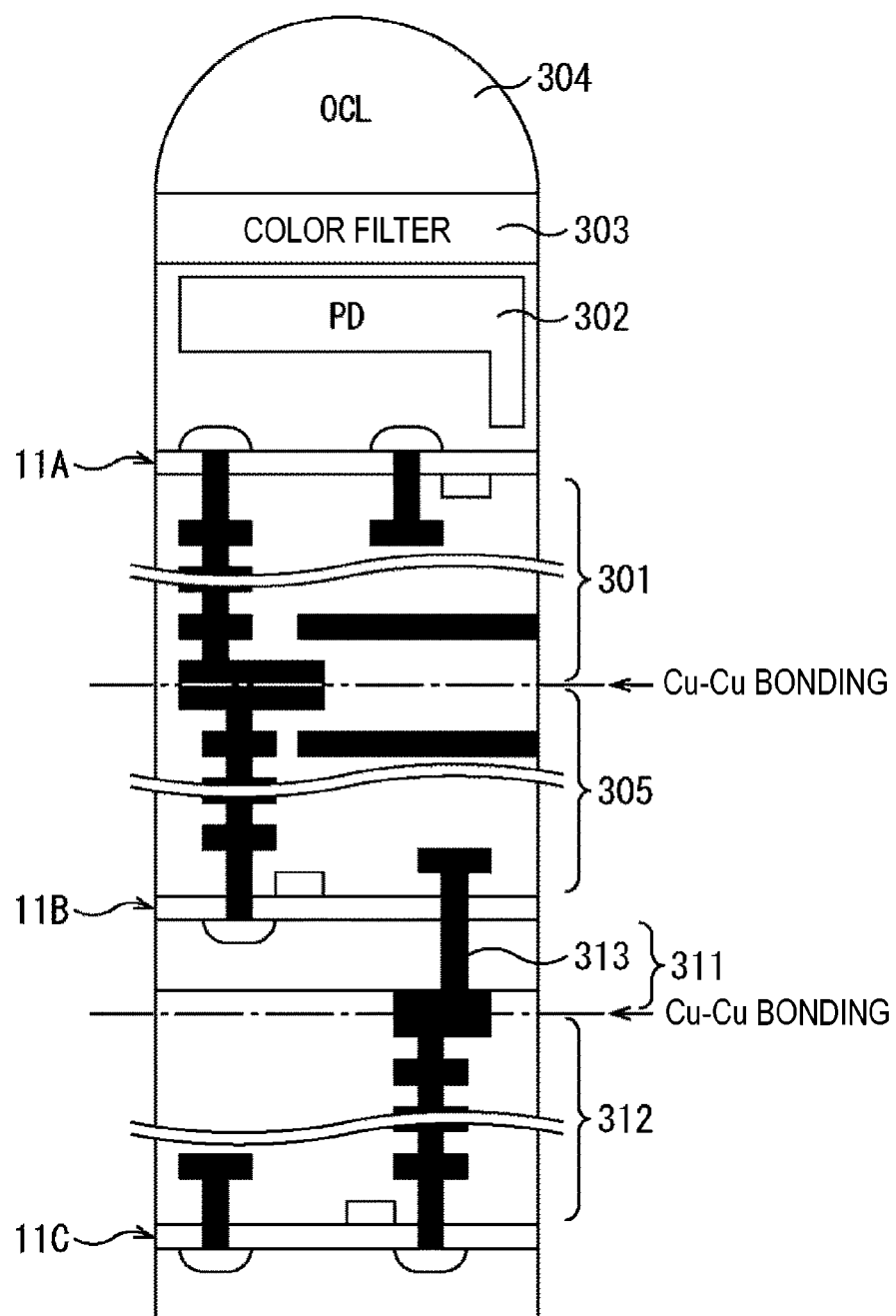
FIG. 15 is a diagram illustrating an exemplary configuration of three semiconductor substrates.

FIG. 15 is a schematic cross-sectional view of a solid state imaging device 1 having three semiconductor substrates 11.

An upper substrate 11A is of a backside illuminated type, in which a photodiode 302, a color filter 303, an on OCL 304, and the like are formed on a back side opposite to a front side on which a wiring layer 301 is formed.

The wiring layer 301 on the upper substrate 11A is bonded to a wiring layer 305 on a front side of an intermediate substrate 11B by Cu—Cu bonding.

The intermediate substrate 11B and a lower substrate 11C are bonded to each other by Cu—Cu bonding between a wiring layer 312 formed on a front side of the lower substrate 11C, and connection wiring 311 on the intermediate substrate 11B. A through via 313 connects between the connection wiring 311 on the intermediate substrate 11B and the wiring layer 305 on the front side of the intermediate substrate 11B.

In the example of FIG. 15, the wiring layer 305 on the front side of the intermediate substrate 11B is connected to face the wiring layer 301 on the upper substrate 11A, but the intermediate substrate 11B may be vertically inverted for bonding so that the wiring layer 305 on the intermediate substrate 11B faces the wiring layer 312 on the lower substrate 11C.

Note that, in the example of FIG. 15, a comparator 51 and a latch unit 52 following a VCO can be separated from each other in terms of configuration and process, and thus a simple configuration can be provided.

For example, the upper substrate 11A is provided with at least pixel circuits 41 and transfer units. The intermediate substrate 11B is provided with at least circuits of the comparison units 51 of ADCS 43. The lower substrate 11C is provided with at least circuits of the latch units 52 of the ADCS 43. In the example of FIG. 15, positional separation may be made at any position basically.

7. Examples of Use of Image Sensor

Figure 16:
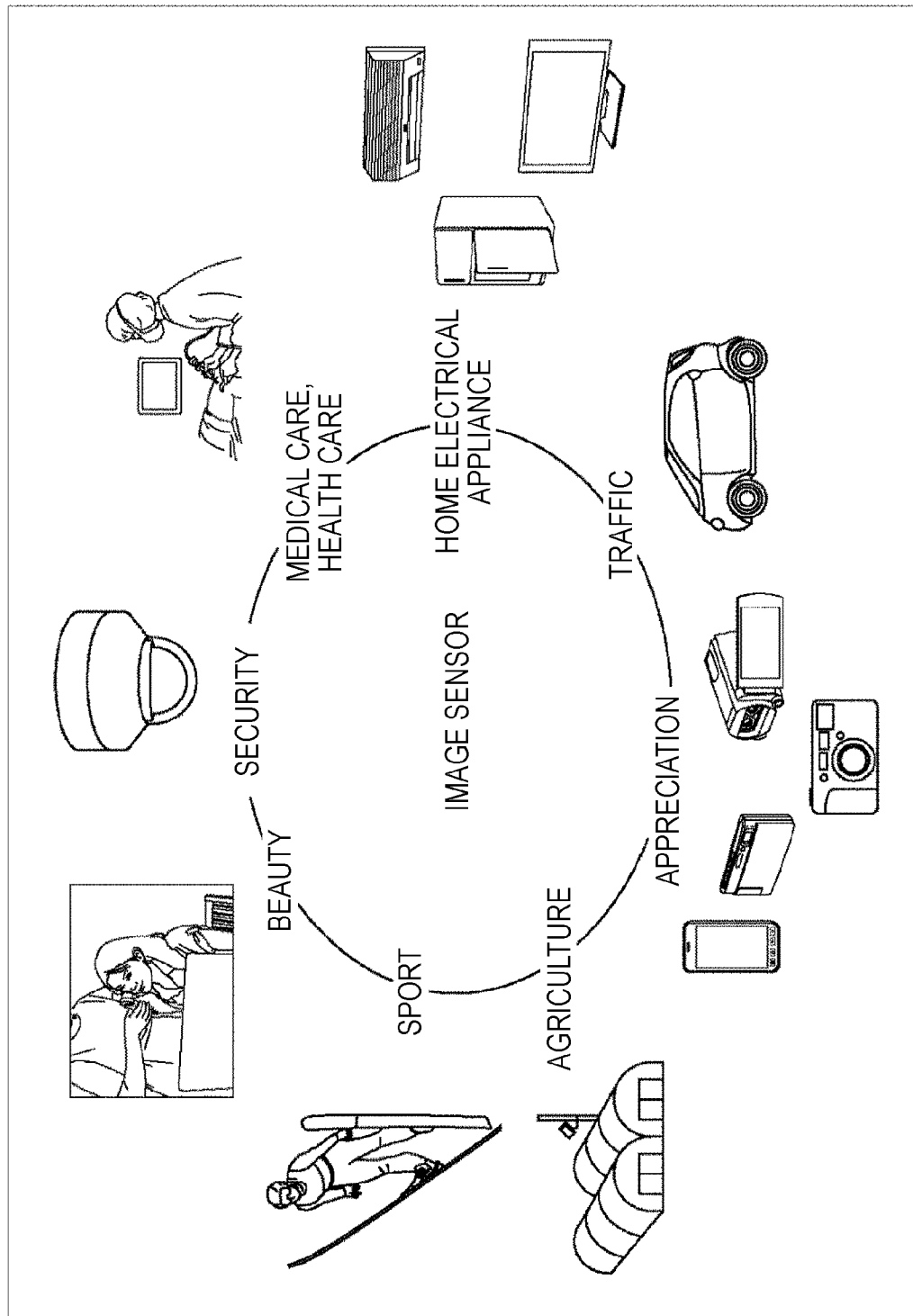
FIG. 16 is a diagram illustrating examples of use of an image sensor.

FIG. 16 is a diagram illustrating exemplary use of the solid state imaging device described above.

The solid state imaging device (image sensor) described above can be used for various cases for sensing light, such as visible light, infrared light, ultraviolet light, or X ray, as following:

A device for capturing an image for appreciation, such as a digital camera or a portable device with camera function;

A traffic-related device, such as a car sensor capturing an image of forward, backward, or peripheral position of a car, inside a car, or the like, for safe driving such as automatic stop or recognition of driver's condition, a monitoring camera monitoring a running vehicle or a road, or a distance measuring sensor measuring a distance between vehicles or the like;

A device used for a home electrical appliance, such as a TV set, a refrigerator, or an air conditioner, which is configured to be operated according to captured user's gesture;

A device for medical care or health care, such as an endoscope, or an angiographic device using infrared light;

A security device, such as a monitoring camera for security or a camera for personal identification;

A device for beauty, such as a skin measurement device capturing a skin image, or a microscope capturing a scalp image;

A device for sport use, such as an action camera or a wearable camera for sport use or the like; and A device for agricultural use, such as a camera monitoring field condition or crop condition.

8. Examples of Application to Electronic Device

The present disclosure is not limited to application to a solid state imaging device. That is, the present disclosure can be generally applied to electronic devices using solid state imaging devices for image capture units (photoelectric converters), including an imaging device such as a digital still camera or a video camera, a portable terminal device having imaging function, a copying machine using a solid state imaging device for an image reading unit, and the like. The solid state imaging device may be formed into one chip, or into a module having an imaging function in which an imaging unit and a signal processing unit or an optical system are collectively packaged.

Figure 17:
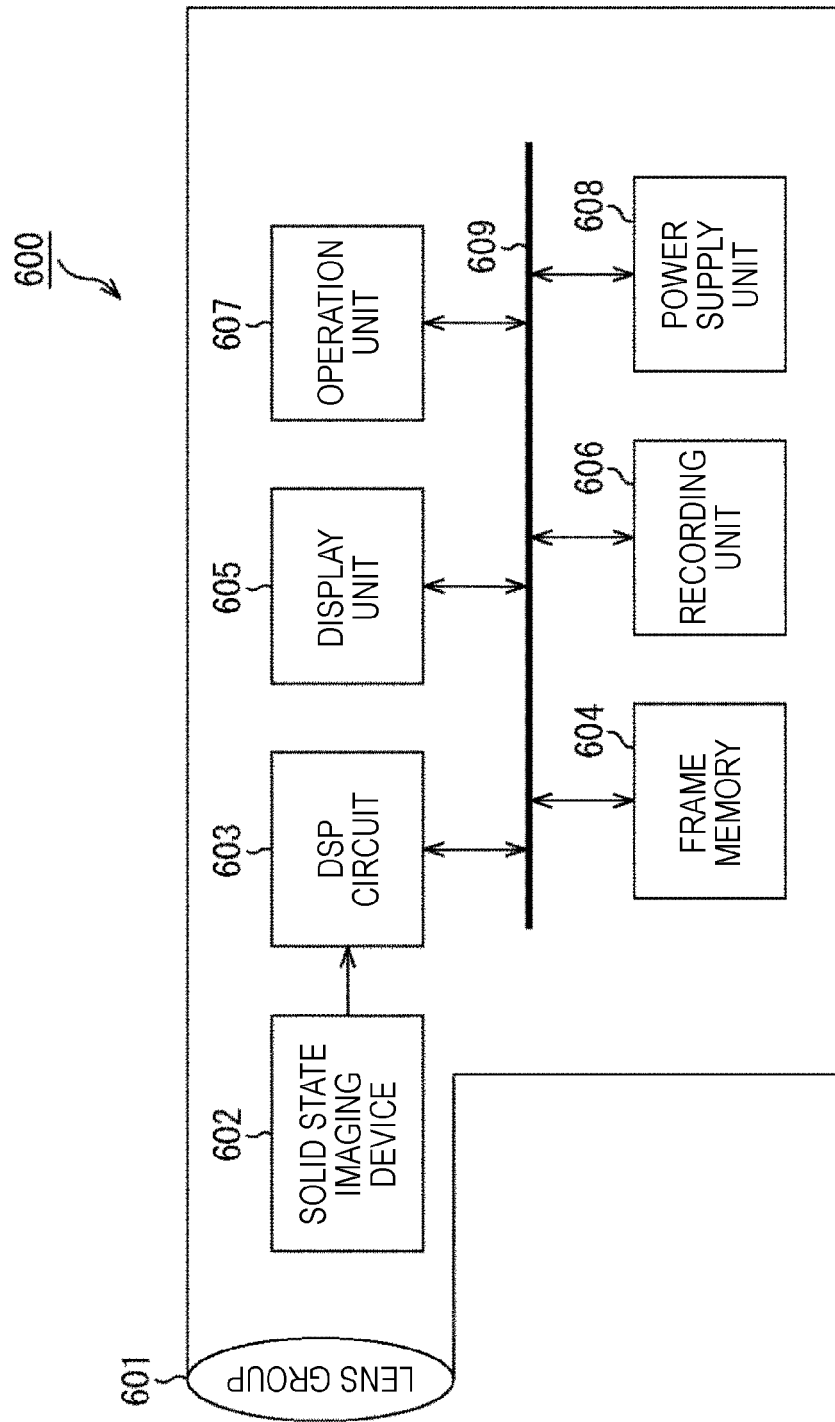
FIG. 17 is a block diagram illustrating an exemplary configuration of an imaging device as an electronic device according to the present disclosure.

FIG. 17 is a block diagram illustrating an exemplary configuration of an imaging device as an electronic device according to the present disclosure.

The imaging device 600 of FIG. 17 includes an optical unit 601 including a lens group and the like, a solid state imaging device (imaging device) 602 in which the configuration of the solid state imaging device 1 of FIG. 1 is adopted, and a digital signal processor (DSP) circuit 603 being a camera signal processing circuit. Furthermore, the imaging device 600 also includes a frame memory 604, a display unit 605, a recording unit 606, an operation unit 607, and a power supply unit 608. The DSP circuit 603, the frame memory 604, the display unit 605, the recording unit 606, the operation unit 607, and the power supply unit 608 are connected with each other through a bus line 609.

The optical unit 601 captures incident light (image light) from an object, and focuses the incident light on an imaging surface of the solid state imaging device 602. The solid state imaging device 602 converts an amount of incident light focused on the imaging surface by the optical unit 601, to an electrical signal for each pixel, and outputs the electrical signal as a pixel signal. As this solid state imaging device 602, the solid state imaging device 1 of FIG. 1, that is, a solid state imaging device in which holding units for holding information (simultaneous distance signals for all pixels) in respective pixels can be eliminated can be used.

The display unit 605 includes, for example, a panel display device such as a liquid crystal panel or an organic electro luminescence (EL) panel, and displays a moving image or a still image captured by the solid state imaging device 602. The recording unit 606 records a moving image or still image captured by the solid state imaging device 602, in a recording medium such as a hard disk or a semiconductor memory.

The operation unit 607 gives operation instructions for various functions of the imaging device 600, according to user's operation. The power supply unit 608 appropriately supplies various power as operation power for the DSP circuit 603, the frame memory 604, the display unit 605, the recording unit 606, and the operation unit 607, to these objects for power supply.

As described above, the solid state imaging device 1 according to the embodiment described above is used as the solid state imaging device 602, and the holding units for holding information (simultaneous distance signals for all pixels) in respective pixels can be eliminated. Furthermore, kT/C (reset noise) can be removed. Accordingly, in the imaging device 600 for a video camera or a digital still camera, and further a camera module for a mobile device such as a mobile phone, the holding unit can be eliminated, and the kT/C (reset noise) can be further eliminated.

Note that, in the above description, the comparator 51 and the ADC 43 are described as components incorporated into the solid state imaging device 1, but each of them may be a product (comparator, AD converter) independently available in the market.

Furthermore, the present disclosure may be generally applied to semiconductor devices having other semiconductor integrated circuits, in addition to the solid state imaging device.

Embodiments of the present disclosure are not limited to the above embodiments, and various modification can be made within the scope of the present disclosure.

As described above, the present disclosure may have a circuit configuration having electrons as charge carriers, and also, though described, may have a circuit configuration having holes as charge carriers. Furthermore, as described above, each circuit configuration can be achieved using a circuit configuration in which the polarity of the transistor (NMOS transistor and PMOS transistor) is reversed. In such a condition, Hi and Low are reversed in a control signal input to a transistor.

As described above, the reference signal REF may be a slope signal having a voltage monotonously decreasing with time, or the reference signal REF may be a slope signal having a voltage monotonously increasing with time.

In addition, a combination of all or part of the above-mentioned embodiments may be employed. Other embodiments not described in the above embodiments may be appropriately combined.

Note that the effects described in the present description are by way of examples only and not limited to the description, and additional effects other than the effects described in the present description may be provided.

It is noted that the present technology also may include the following configuration.

(1) A solid state imaging device including, for each pixel,
one light receiving unit receiving light input to a pixel for photoelectrical conversion,
a dividing unit dividing a pixel signal from the light receiving unit, for allocation, and
at least two AD converters each converting each pixel signal divided for allocation by the dividing unit, to a digital signal.

(2) The solid state imaging device according to (1), in which
the pixel signals divided for allocation are subjected to A/D conversion in terms of signal level, on the basis of any of at least two kinds of conversion efficiencies.

(3) The solid state imaging device according to (1) or (2), in which
emission timing of IR light from outside is controlled to divide a pixel signal representing reflection light resulting from reflection of the IR light received by the light receiving unit into at least two for allocation, by the dividing unit.

(4) The solid state imaging device according to any of (1) to (3), in which
the dividing unit divides a pixel signal from the light receiving unit into four, for allocation.

(5) The solid state imaging device according to any of (1) to (4), in which
the dividing unit divides a pixel signal from the light receiving unit, for application to three AD converters and one discharge unit.

(6) The solid state imaging device according to any of (1) to (3), further including
an in-phase component removal unit removing an in-phase component from a pixel signal from the light receiving unit, for each pixel,
in which the dividing unit divides a pixel signal from the light receiving unit into two, for allocation.

(7) The solid state imaging device according to any of (1) to (6), in which
the A/D converter includes
a comparison unit comparing a pixel signal from the light receiving unit and a reference signal for comparison with the pixel signal to output a comparison result, and
a storage unit storing a signal upon reversal of a comparison result from the comparison unit, as a digital value.

(8) The solid state imaging device according to any of (1) to (7), in which
the storage unit has a dynamic latch.

(9) The solid state imaging device according to any of (1) to (7), in which
the storage unit has a static latch.

(10) The solid state imaging device according to any of (1) to (7) in which
the storage unit has an up-down counter.

(11) The solid state imaging device according to any of (1) to (10), further including
a plurality of semiconductor substrates.

(12) The solid state imaging device according to any of (1) to (11), in which
the pixels are illuminated from backside.

(13) The solid state imaging device according to any of (1) to (12), in which
the distribution unit includes a transfer transistor.
(14) The solid state imaging device according to any of (1) to (13), in which
the dividing unit divides electrical charge from the light receiving unit by time division, for allocation.
(15) An electronic device including
a solid state imaging device including, for each pixel,
one light receiving unit receiving light input to a pixel for photoelectrical conversion,
a dividing unit dividing a pixel signal from the light receiving unit, and
at least two AD converters each converting each pixel signal divided by the dividing unit to a digital signal,
a signal processing circuit processing an output signal output from the solid state imaging device, and
an optical system inputting incident light to the solid state imaging device.

REFERENCE SIGNS LIST

1 Solid state imaging device
11 Semiconductor substrate
11A Upper substrate
11B Intermediate substrate
11C Lower substrate
21 Pixel (unit)
24 DAC
26 Sense amplifier unit
41 Pixel circuit
42 Charge distribution unit
43, 43-1 to 43-3 ADC
51, 51-1 to 51-3 Comparator
52, 52-1 to 52-3 Latch unit
71, 71-1 to 71-3 Transfer transistor
72 Discharge transistor
73, 73-1 to 73-3 FD
81 Reset transistor
91 Background light-removing unit
101, 101-1 to 101-N Latch circuit
111 to 113 Transistor
114 Latch input/output common line
151 Latch circuit
161 Multiplexer
162, 162-1 to 162-3 Static latch
163 Latch input/output common line
171 NOR circuit
172, 173 Inverter
181 Switch
182, 183 Inverter
301 Wiring layer
302 Photodiode
303 Color filter
304 OCL
305 Wiring layer
311 Connection wiring
312 Wiring layer
600 Imaging apparatus
601 Optical unit
602 Solid state imaging device
603 DSP circuit

What is claimed is:

1. A light detecting device comprising:
a plurality of pixels, wherein a first pixel of the plurality of pixels comprises:
a photoelectric conversion region;
a dividing circuit that receives a pixel signal from the photoelectric conversion region and divides the pixel signal into a first pixel signal and a second pixel signal;
a first analog-digital converter that converts the first pixel signal to a first digital signal; and
a second analog-digital converter that converts the second pixel signal to a second digital signal,
wherein the first digital signal and the second digital signal are output from the first pixel of the plurality of pixels to a data bus.

2. The light detecting device according to claim 1, wherein the first analog-digital converter converts the first pixel signal to the first digital signal in terms of signal level on a basis of a first conversion efficiency and the second analog-digital converter converts the second pixel signal to the second digital signal in terms of signal level on a basis of a second conversion efficiency different from the first conversion efficiency.

3. The light detecting device according to claim 1, wherein the dividing circuit divides the pixel signal by controlling emission timing of infrared light received by the photoelectric conversion region from outside the photoelectric conversion region, wherein dividing the pixel signal represents reflection light resulting from reflection of the infrared light.

4. The light detecting device according to claim 3, wherein the dividing circuit divides the pixel signal into four divided pixel signals for allocation.

5. The light detecting device according to claim 4, wherein the dividing circuit divides the pixel signal for application to three analog-digital converters and one discharge unit.

6. The light detecting device according to claim 3, further comprising
an in-phase component removal unit configured to remove an in-phase component from the pixel signal.

7. The light detecting device according to claim 3, wherein the first analog-digital converter includes
a comparison unit configured to compare the pixel signal with a reference signal and output a comparison result, and
a storage unit configured to store a signal upon reversal of the comparison result as a digital value.

8. The light detecting device according to claim 7, wherein the storage unit has a dynamic latch.

9. The light detecting device according to claim 7, wherein the storage unit has a static latch.

10. The light detecting device according to claim 7, wherein the storage unit has an up-down counter.

11. The light detecting device according to claim 1, further comprising a plurality of semiconductor substrates.

12. The light detecting device according to claim 1, wherein each pixel of the plurality of pixels is illuminated from a backside.

13. The light detecting device according to claim 1, wherein the dividing circuit includes a transfer transistor.

14. The light detecting device according to claim 1, wherein the dividing circuit divides an electrical charge signal from the photoelectric conversion region by time division for allocation.

15. The light detecting device according to claim 1, wherein the first pixel signal is a background light pixel signal and the second pixel signal is a reflection light pixel signal, and wherein the background light pixel signal and the reflection light pixel signal to perform distance measurement output to the data bus.

16. The light detecting device according to claim 15, wherein the first digital signal and the second digital signal are associated with the background light pixel signal and the reflection light pixel signal, respectively, and are sequentially output from each pixel of the plurality of pixels to a data bus.

17. A device comprising:
a light detecting device including a plurality of pixels, wherein a first pixel of the plurality of pixels comprises:
a photoelectric conversion region;
a dividing unit circuit that receives a pixel signal from the photoelectric conversion region and divides the pixel signal into a first pixel signal and a second pixel signal;
a first analog-digital converter that converts the first pixel signal to a first digital signal; and
a second analog-digital converter that convert the second pixel signal to a second digital signal,
wherein the first digital signal and the second digital signal are output from the first pixel of the plurality of pixels to a data bus;
a signal processing circuit that processes an output signal output from the light detecting device; and
an optical system that inputs incident light to the light detecting device.

18. The device according to claim 17, wherein the first analog-digital converter converts the first pixel signal to the first digital signal in terms of signal level on a basis of a first conversion efficiency and the second analog-digital converter converts the second pixel signal to the second digital signal in terms of signal level on a basis of a second conversion efficiency different from the first conversion efficiency.

19. The device according to claim 17, wherein the dividing unit circuit divides the pixel signal by controlling emission timing of infrared light received by the photoelectric conversion region from outside the photoelectric conversion region, wherein dividing the pixel signal represents reflection light resulting from reflection of the infrared light.

20. The device according to claim 19, wherein the dividing unit circuit divides the pixel signal into four divided pixel signals for allocation.

* * * * *